US012813276B2

(12) United States Patent
Hatori

(10) Patent No.: US 12,813,276 B2
(45) Date of Patent: Nov. 24, 2026

(54) SEMICONDUCTOR DEVICE

(71) Applicant: SHINKO ELECTRIC INDUSTRIES CO., LTD., Nagano (JP)

(72) Inventor: Yukinori Hatori, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 328 days.

(21) Appl. No.: 18/603,518

(22) Filed: Mar. 13, 2024

(65) Prior Publication Data

US 2024/0312868 A1 Sep. 19, 2024

(30) Foreign Application Priority Data

Mar. 16, 2023 (JP) ................................ 2023-041970

(51) Int. Cl.

| | |
|---|---|
| ***H10W 40/77*** | (2026.01) |
| ***H10W 40/22*** | (2026.01) |
| ***H10W 70/02*** | (2026.01) |
| ***H10W 70/05*** | (2026.01) |
| ***H10W 74/01*** | (2026.01) |

(Continued)

(52) U.S. Cl.

CPC ......... *H10W 40/778* (2026.01); *H10W 40/22* (2026.01); *H10W 70/027* (2026.01); *H10W 70/093* (2026.01); *H10W 74/014* (2026.01); *H10W 74/114* (2026.01); *H10W 72/016* (2026.01); *H10W 72/072* (2026.01); *H10W 72/07236* (2026.01); *H10W 72/252* (2026.01); *H10W 90/726* (2026.01)

(58) Field of Classification Search

CPC .......... H10W 40/22–228; H10W 40/231–235; H10W 40/258; H10W 40/255; H10W 74/111; H10W 74/114; H10W 40/778; H10W 70/461

See application file for complete search history.

(56) References Cited

U.S. PATENT DOCUMENTS

| | | | | |
|---|---|---|---|---|
| 6,559,536 B1 * | 5/2003 | Katoh | ................ | H10W 70/468 257/713 |
| 9,653,445 B2 * | 5/2017 | Lin | ........................ | H10P 74/23 |

(Continued)

FOREIGN PATENT DOCUMENTS

| | | |
|---|---|---|
| JP | 2017174849 A | 9/2017 |

*Primary Examiner* — Bac H Au

(74) *Attorney, Agent, or Firm* — Renner, Otto, Boisselle & Sklar, LLP

(57) ABSTRACT

A semiconductor device includes a wiring substrate, a semiconductor element mounted on the wiring substrate, a heat dissipating plate arranged above the semiconductor element, and an encapsulation resin that encapsulates the semiconductor element and fills a space between the wiring substrate and the heat dissipating plate and a space between the semiconductor element and the heat dissipating plate. The heat dissipating plate includes a main body arranged overlapping the semiconductor element in plan view, and a lead projecting outward from the main body. The lead is thinner than the main body. The lead includes an upper surface covered by the encapsulation resin, and an outer side surface located at an outer edge of the semiconductor device and exposed from an outer side surface of the encapsulation resin. The main body includes an upper surface exposed from an outer surface of the encapsulation resin.

13 Claims, 20 Drawing Sheets

(51) Int. Cl.

| | |
|---|---|
| ***H10W 74/10*** | (2026.01) |
| *H10W 72/00* | (2026.01) |
| *H10W 72/20* | (2026.01) |
| *H10W 90/00* | (2026.01) |

(56) References Cited

U.S. PATENT DOCUMENTS

| | | | | |
|---|---|---|---|---|
| 10,985,083 | B2 * | 4/2021 | Nishimura | H10W 40/255 |
| 2001/0009302 | A1 * | 7/2001 | Murayama | H10W 40/257<br>257/706 |
| 2003/0058630 | A1 * | 3/2003 | Takano | H05K 1/0206<br>257/E23.101 |
| 2005/0077615 | A1 * | 4/2005 | Yu | H10W 40/22<br>257/E23.102 |
| 2005/0167849 | A1 * | 8/2005 | Sato | H10W 74/114<br>257/E23.125 |
| 2011/0079902 | A1 * | 4/2011 | Sakamoto | H10W 40/611<br>257/788 |
| 2016/0133541 | A1 * | 5/2016 | Ozawa | H10W 40/778<br>257/773 |
| 2017/0162464 | A1 * | 6/2017 | Morino | H10W 40/22 |
| 2017/0271233 | A1 | 9/2017 | Imai | |
| 2017/0287805 | A1 * | 10/2017 | Ozawa | H10W 40/22 |
| 2020/0027814 | A1 * | 1/2020 | Ichiryu | H10W 40/10 |
| 2020/0152601 | A1 * | 5/2020 | Igarashi | H10W 40/10 |
| 2022/0181231 | A1 * | 6/2022 | Kurosawa | H10W 40/22 |
| 2022/0181287 | A1 * | 6/2022 | Ito | H10W 74/141 |
| 2025/0191987 | A1 * | 6/2025 | Sekijima | H10W 74/014 |
| 2026/0068693 | A1 * | 3/2026 | Salman | H10W 70/442 |

* cited by examiner

SEMICONDUCTOR DEVICE

CROSS-REFERENCE TO RELATED APPLICATIONS

This application is based upon and claims the benefit of priority from prior Japanese Patent Application No. 2023-041970, filed on Mar. 16, 2023, the entire contents of which are incorporated herein by reference.

FIELD

This disclosure relates to a semiconductor device and a method for manufacturing a semiconductor device.

BACKGROUND

Japanese Laid-Open Patent Publication No. 2017-174849 describes a semiconductor device including a wiring substrate, a semiconductor element mounted on the wiring substrate, a lead frame mounted on the wiring substrate with connecting members, and an encapsulation resin encapsulating the semiconductor element and the connecting members. A heat dissipator is formed in the lead frame of such a semiconductor device.

In the above-described semiconductor device, when warping occurs in the above-described semiconductor device, the lead frame may be delaminated from the encapsulation resin. Delamination of the lead frame from the encapsulation lead will adversely affect the heat dissipation performance of the semiconductor device.

SUMMARY

This Summary is provided to introduce a selection of concepts in a simplified form that are further described below in the Description of the Embodiments. This Summary is not intended to identify key features or essential features of the claimed subject matter, nor is it intended to be used as an aid in determining the scope of the claimed subject matter.

In one general aspect, a semiconductor device includes a wiring substrate, a semiconductor element mounted on the wiring substrate, a heat dissipating plate arranged above the semiconductor element, and an encapsulation resin that encapsulates the semiconductor element and fills a space between the wiring substrate and the heat dissipating plate and a space between the semiconductor element and the heat dissipating plate. The heat dissipating plate includes a main body arranged overlapping the semiconductor element in plan view, and a lead projecting outward from the main body. The lead is thinner than the main body. The lead includes an upper surface covered by the encapsulation resin, and an outer side surface located at an outer edge of the semiconductor device and exposed from an outer side surface of the encapsulation resin. The main body includes an upper surface exposed from an outer surface of the encapsulation resin.

Other features and aspects will be apparent from the following detailed description, the drawings, and the claims.

BRIEF DESCRIPTION OF THE DRAWINGS

The embodiments, together with objects and advantages thereof, may best be understood by reference to the following description of the presently preferred embodiments together with the accompanying drawings.

Throughout the drawings and the detailed description, the same reference numerals refer to the same elements.

DESCRIPTION OF THE EMBODIMENTS

Figure 1A:
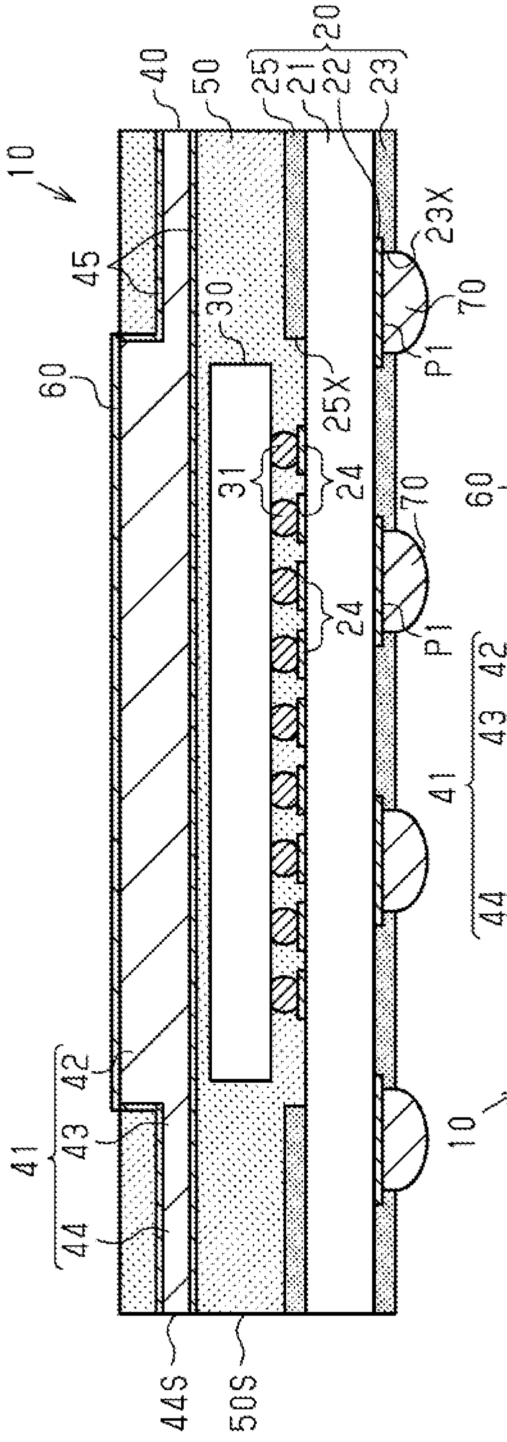
FIG. 1A is a schematic cross-sectional view of a semiconductor device according to one embodiment taken along line 1-1 in FIG. 2.

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

One embodiment will now be described with reference to the drawings.

In the accompanying drawings, elements are illustrated for simplicity and clarity and have not necessarily been drawn to scale. To facilitate understanding, hatching lines may not be illustrated or be replaced by shadings in the cross-sectional views. In this specification, a plan view refers to a view of a subject taken in a vertical direction (e.g., vertical direction as viewed in FIG. 1A), and a planar shape refers to a shape of a subject as viewed in the vertical direction. Further, in this specification, upward, downward, leftward, and rightward directions refer to directions that allow for the reference characters denoting members to be read properly. In this specification, the term “face” is used to indicate that surfaces or members are arranged in front of each other. In this case, the objects do not have to be entirely in front of each other and may be partially in front of each other. The term “face” as used in this specification includes a situation in which a member is located between two portions and a situation in which there is no member between two portions.

Structure of Entire Semiconductor Device 10

With reference to FIG. 1A, the structure of a semiconductor device 10 will now be described.

The semiconductor device 10 includes a wiring substrate 20, at least one semiconductor element 30, a heat dissipating plate 40, an encapsulation resin 50, a metal layer 60, and external connection terminals 70.

Structure of Wiring Substrate 20

The wiring substrate 20 includes, for example, a substrate body 21. A wiring layer 22 and a solder resist layer 23 are sequentially formed on the lower surface of the main substrate body 21. A wiring layer 24 and a solder resist layer 25 are sequentially formed on the upper surface of the substrate body 21.

A wiring structure of alternately stacked insulative resin layers and wiring layers may be used as the main substrate body 21. The wiring structure, for example, may include a core substrate but does not have to include a core substrate. The material of the insulative resin layers may be, for example, an insulative thermosetting resin. The insulative thermosetting resin may be, for example, an insulative resin such as an epoxy resin, a polyimide resin, or a cyanate resin. The material of the insulative resin layers may also be, for example, an insulative resin of which the main component is a photosensitive resin such as a phenolic resin or a polyimide resin. The insulative resin layers may include, for example, a filler of silica or alumina.

The material of the wiring layers in the substrate body 21 and the wiring layers 22 and 24 on the lower and upper surfaces of the substrate body 21 may be, for example, copper (Cu) or a copper alloy. The material of the solder resist layers 23 and 25 may be, for example, an insulative resin of which the main component is a photosensitive resin such as a phenolic resin or a polyimide resin. The solder resist layers 23 and 25 may contain, for example, a filler such as silica or alumina.

The wiring layer 22 is formed on the lower surface of the substrate body 21. The wiring layer 22 is the lowermost wiring layer of the wiring substrate 20.

The solder resist layer 23, which is formed on the lower surface of the substrate body 21, covers parts of the wiring layer 22. The solder resist layer 23 is the outermost insulation layer (here, lowermost insulation layer) of the wiring substrate 20.

The solder resist layer 23 includes openings 23X exposing parts of the lower surface of the wiring layer 22 as external connection pads P1. The external connection terminals 70 are connected to the external connection pads P1. The external connection terminals 70 are used to mount the wiring substrate 20 on a mounting substrate such as a motherboard.

A surface-processed layer is formed, if necessary, on the lower surface of the wiring layer 22 exposed at the bottom of each opening 23X. Examples of the surface-processed layer includes a gold (Au) layer, a nickel (Ni) layer/Au layer (metal layer in which Ni layer serves as bottom layer, and Au layer is formed on Ni layer), Ni layer/palladium (Pd) layer/Au layer (metal layer in which Ni layer serves as bottom layer, and Ni layer and Pd layer are sequentially formed on Au layer). Further examples of the surface-processed layer include Ni layer/Pd layer (metal layer in which Ni layer serves as bottom layer, and Pd layer is formed on Ni layer), Pd layer/Au layer (metal layer in which Pd layer serves as bottom layer, and Au layer is formed on Pd layer). An Au layer is a metal layer formed from Au or an Au alloy, an Ni layer is a metal layer formed from Ni or an Ni alloy, and a Pd layer is a metal layer formed from Pd or a Pd alloy. The Au layer, Ni layer, and Pd layer may be, for example, a metal layer formed through an electroless plating process (electroless plating layer) or a metal layer formed through an electrolytic plating process (electrolytic plating layer). Further, the surface-processed layer may be an organic solderability preservative (OSP) film formed by performing an oxidation-resisting process on the lower surface of the wiring layer 22 exposed from the openings 23X. The OSP film may be an organic coating of an azole compound or an imidazole compound. When a surface-processed layer is formed on the lower surface of the wiring layer 22, the surface-processed layer functions as the external connection pads P1.

In the present example, the external connection terminals 70 are arranged on the lower surface of the wiring layer 22. Instead, the wiring layer 22 exposed at the bottom of each opening 23X or the surface-processed layer formed on the lower surface of the wiring layer 22 may be used as external connection terminals.

The wiring layer 24 is formed on the upper surface of the substrate body 21. The wiring layer 24 is electrically connected to the wiring layer 22 by, for example, the wiring layers and through-electrodes in the substrate body 21. The wiring layer 24 on the upper surface of the substrate body 21 has, for example, the form of a matrix. The wiring layer 24 is the uppermost wiring layer of the wiring substrate 20. The wiring layer 24, for example, functions as electronic component mounting pads electrically connected to an electronic component such as the semiconductor element 30.

The wiring layer 24 is stacked on the upper surface of the substrate body 21 and exposed from the solder resist layer 25. The solder resist layer 25, for example, surrounds the mounting region where the semiconductor element 30 is mounted. That is, the solder resist layer 25 includes an opening 25X that exposes the upper surface of the substrate body 21 and the wiring layer 24 in the mounting region. The solder resist layer 25 is the outermost insulation layer (uppermost insulation layer) of the wiring substrate 20.

Structure of Semiconductor Element 30

The semiconductor element 30 includes connection terminals 31 formed on a circuit formation surface (lower surface in this case) of the semiconductor element 30. The semiconductor element 30 includes, for example, a thin semiconductor substrate of silicon (Si) or the like, a passivation film that is formed on the semiconductor substrate and covers the circuit formation circuit where semiconductor integrated circuits (not illustrated) are formed, and the connection terminals 31 that are formed on the circuit formation surface.

The semiconductor element 30 may be, for example, a logic chip such as a central processing unit (CPU) chip or a graphics processing unit (GPU) chip. Further, the semiconductor element 30 may be, for example, a memory chip such as a dynamic random access memory (DRAM) chip or a flash memory chip. Further, the semiconductor element 30 may be, for example, an analog IC with high heat dissipation. Further, the semiconductor element 30 may be a chip scale package (CSP) with high heat dissipation. The semiconductor element 30 may have any shape and size in plan view. The semiconductor element 30 may be, for example, tetragonal in plan view. The semiconductor element 30 may be dimensioned to be, for example, approximately 10 mm×10 mm in plan view. The semiconductor element 30 may have a thickness of, for example, approximately 10 μm to 200 μm.

The semiconductor element 30 is flip-chip-mounted on the wiring substrate 20. In the present example, the semiconductor element 30 is electrically connected by the connection terminals 31 to the wiring layer 24 of the wiring substrate 20. The connection terminals 31 may be, for example, gold (Au) bumps or solder bumps. The material of the solder bumps may be, for example, an alloy including lead (Pb), an alloy of Tin (Sn) and Cu, an alloy of Sn and silver (Ag), or an alloy of Sn, Ag, and Cu.

Structure of Heat Dissipating Plate 40

The heat dissipating plate 40 is arranged above the semiconductor element 30. The heat dissipating plate 40 is arranged above the back surface (upper surface) of the semiconductor element 30 at the side opposite to the circuit formation surface with the encapsulation resin 50 located in between. The heat dissipating plate 40 is embedded in the encapsulation resin 50. The heat dissipating plate 40 is supported by, for example, only the encapsulation resin 50. For example, the heat dissipating plate 40 is supported above the wiring substrate 20 by only the encapsulation resin 50, and supported above the semiconductor element 30 by only the encapsulation resin 50. The heat dissipating plate 40 is also referred to as a heat spreader. The heat dissipating plate 40 lowers the concentration of the heat generated by the semiconductor element 30.

Figure 2:
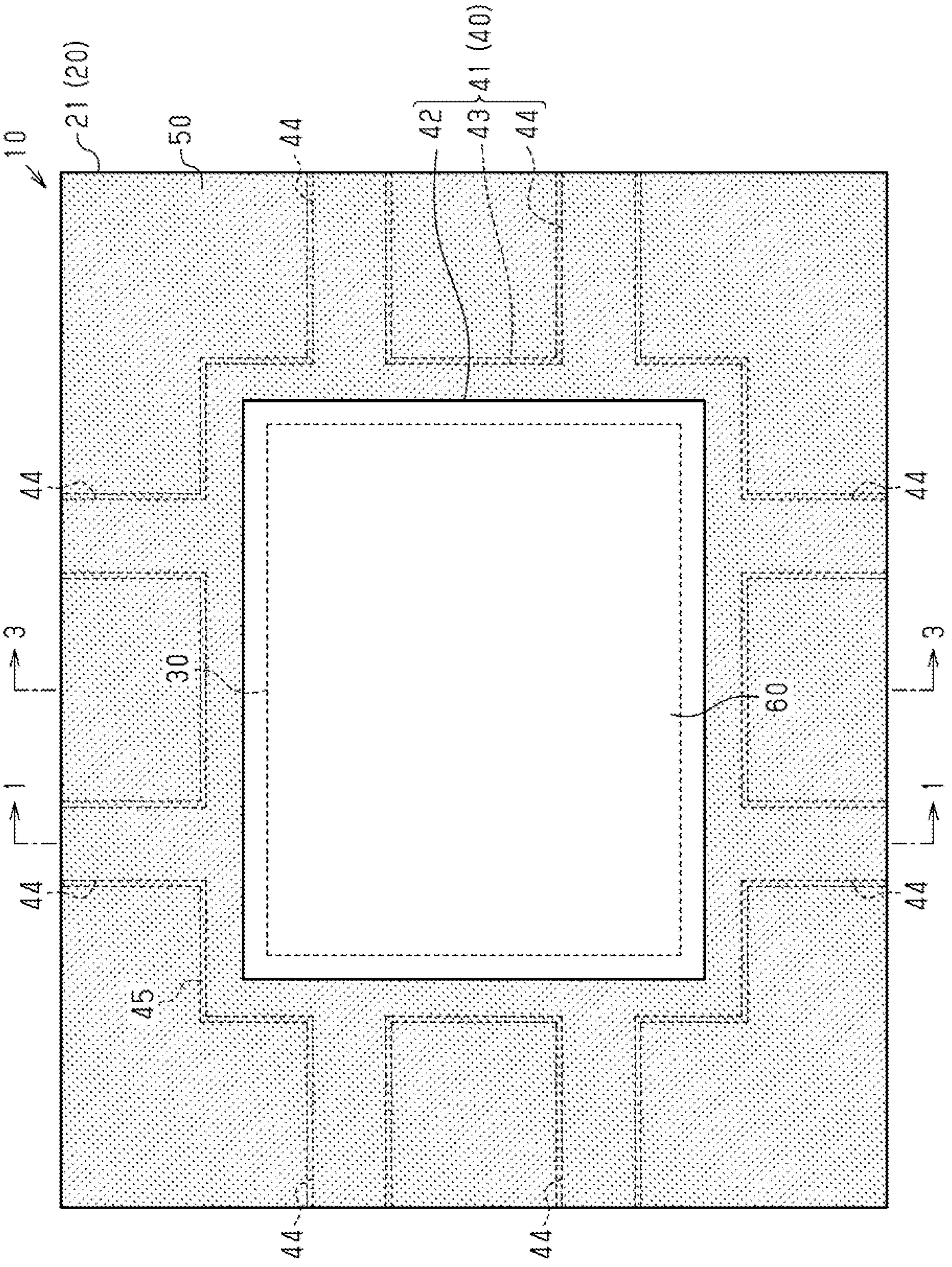
FIG. 2 is a schematic plan view of the semiconductor device illustrated in FIG. 1A.

As illustrated in FIGS. 1A and 2, the heat dissipating plate 40 includes, for example, a base 41 and a surface-processed layer 45. The base 41 includes a main body 42, a projection 43, and multiple (eight, in this example) leads 44. The main body 42, the projection 43, and the leads 44 are integrated in a continuous manner to form the base 41.

Structure of Base 41

The main body 42 has the form of, for example, a flat plate. The main body 42 overlaps the semiconductor element 30 in plan view. The main body 42 overlaps, for example, the entire semiconductor element 30. The main body 42 is, for example, arranged in the mounting region of the semiconductor element 30. As illustrated in FIG. 2, the planar shape of the main body 42 is tetragonal and similar to the planar shape of the semiconductor element 30. That is, the contour of the main body 42 is a tetragon in plan view. The main body 42 is, for example, larger in size than the semiconductor element 30 in plan view. The main body 42 is, for example, smaller in size than the substrate body 21 in plan view. The main body 42 may have a thickness of, for example, approximately 0.15 mm to 0.40 mm.

As illustrated in FIG. 1A, the main body 42 includes a lower surface facing the semiconductor element 30 and an upper surface at the side opposite the lower surface. The lower surface of the main body 42 is thermally coupled to the back surface of the semiconductor element 30 by the encapsulation resin 50. The upper surface of the main body 42 is exposed from the encapsulation resin 50. The upper surface of the main body 42 is, for example, flush with the upper surface of the encapsulation resin 50.

As illustrated in FIG. 2, the projection 43 surrounds the outer edge of the main body 42 in plan view. The projection 43, for example, continuously surrounds the entire periphery of the main body 42.

Figure 3:
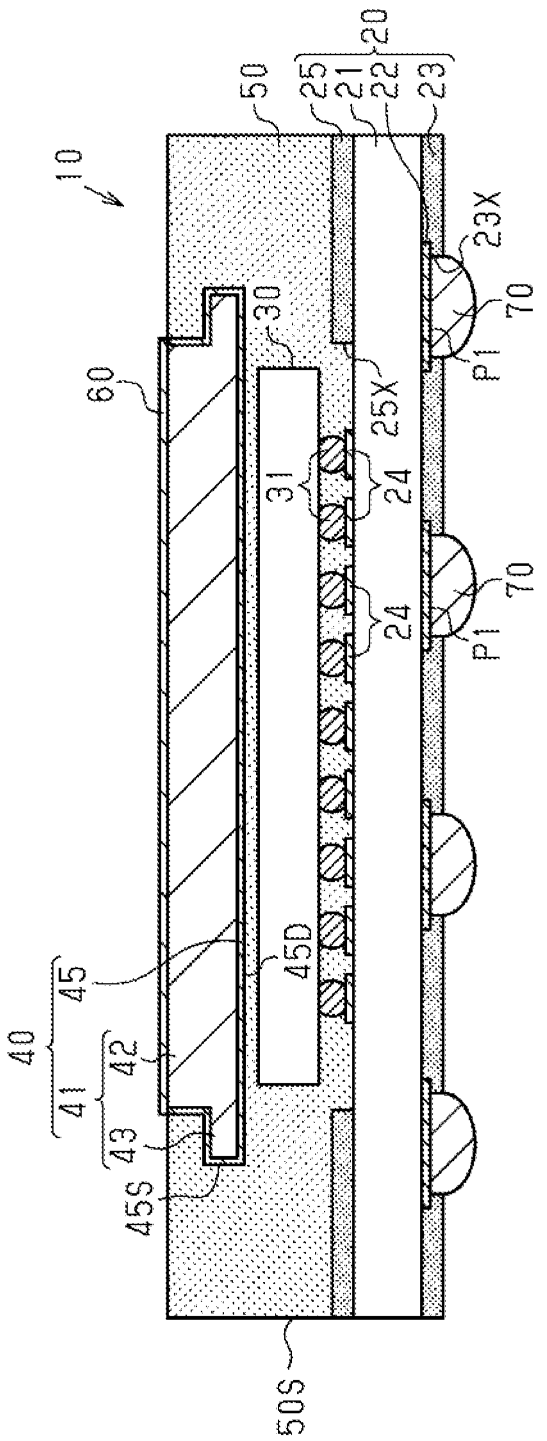
FIG. 3 is a cross-sectional view taken along line 3-3 in FIG. 2.

As illustrated in FIG. 3, the projection 43 projects outward from the side surfaces of the main body 42. The projection 43, for example, projects from the side surfaces of the main body 42 toward the outer edges of the semiconductor device 10. The projection 43 is, for example, thinner than the main body 42. The projection 43 has a thickness that is, for example, approximately 0.3 to 0.7 times the main body 42. The thickness of the projection 43 may be, for example, approximately 0.1 mm to 0.2 mm. The projection 43 is located closer to the wiring substrate 20 than the upper surface of the main body 42. The upper surface of the projection 43 is located below the upper surface of the main body 42. The upper surface of the projection 43 is, for example, covered by the encapsulation resin 50. The lower surface of the projection 43 is, for example, flush with the lower surface of the main body 42. The lower surface of the projection 43 is, for example, covered by the encapsulation resin 50. The side surfaces of the projection 43 are, for example, covered by the encapsulation resin 50.

As illustrated in FIG. 2, the leads 44, for example, project outward from side surfaces of the projections 43. For example, the leads 44 project from the side surfaces of the projection 43, which are located toward the outer side of the semiconductor device 10, toward the outer edge of the semiconductor device 10. The leads 44, for example, extend to the outer side surfaces of the semiconductor device 10.

The leads 44 are, for example, are arranged at intervals around the main body 42. The leads 44 are, for example, arranged in a peripheral region of the semiconductor device 10. The leads 44 are spaced apart from one another and arranged at predetermined intervals along the outer edges of the semiconductor device 10. The leads 44 are, for example, arranged on at least two of the four sides of the tetragonal contour of the main body 42. In the present embodiment, two leads 44 are arranged on each of the four sides of the contour of the main body 42.

As illustrated in FIG. 1A, the leads 44 each have, for example, the same thickness as the projection 43. The leads 44 are each, for example, thinner than the main body 42. The leads 44 each have a thickness that is, for example, approximately 0.3 to 0.7 times the main body 42. The thickness of each lead 44 may be, for example, approximately 0.1 mm to 0.2 mm. Each lead 44 is located closer to the wiring substrate 20 than the upper surface of the main body 42. The upper surface of each lead 44 is located below the upper surface of the main body 42. The upper surface of each lead portion 44 is, for example, flush with the upper surface of the projection 43. The upper surface of each lead 44 is, for example, covered by the encapsulation resin 50. The lower surface of each lead 44 is, for example, flush with the lower surface of the main body 42 and the lower surface of the projection 43. The lower surface of each lead 44 is, for example, covered by the encapsulation resin 50.

Figure 4:
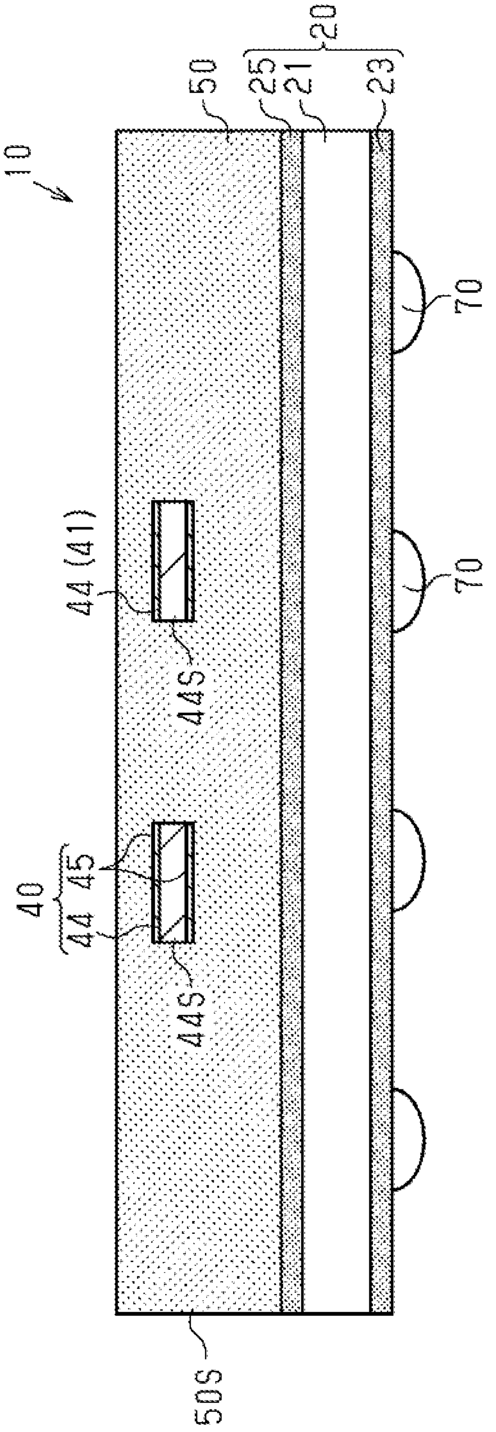
FIG. 4 is a schematic side view of the semiconductor device illustrated in FIG. 1A.

As illustrated in FIGS. 1A and 4, the leads 44 each include an outer side surface 44S that is located at an outer edge of the semiconductor device 10 and exposed from an outer side surface 50S of the encapsulation resin 50. The outer side surface 44S of each lead 44 is, for example, flush with the corresponding outer side surface 50S of the encapsulation resin 50. As illustrated in FIG. 2, the encapsulation resin 50 covers each lead 44 except for the outer side surface 44S.

Structure of Surface-Processed Layer 45

As illustrated in FIG. 1A, the surface-processed layer 45 covers the lower surface of the main body 42. The surface-processed layer 45, for example, covers the entire lower surface of the main body 42. The surface-processed layer 45, for example, covers the entire lower surface of the main body 42, the entire lower surface of the projection 43, and the entire lower surface of each lead 44. Thus, the surface-processed layer 45 covers the entire lower surface of the base 41.

The surface-processed layer 45, for example, exposes the upper surface of the main body 42. In other words, the surface-processed layer 45 is not formed on the upper surface of the main body 42. The surface-processed layer 45, for example, covers the upper surface of the projection 43. The surface-processed layer 45, for example, covers the upper surface of each lead 44. The surface-processed layer 45, for example, covers the entire upper surface of the base 41 except for the upper surface of the main body 42.

The surface-processed layer 45, for example, covers the side surfaces of the main body 42. As illustrated in FIG. 3, the surface-processed layer 45, for example, covers the side surfaces of the projection 43. As illustrated in FIG. 2, the surface-processed layer 45, for example, covers the side surfaces of the leads 44. As illustrated in FIG. 1A, the surface-processed layer 45, for example, exposes the outer side surface 44S of each lead 44 located at the corresponding outer edge of the semiconductor device 10. In other words, the surface-processed layer 45 is not formed on the outer side surface 44S of each lead 44. The surface-processed layer 45, for example, entirely covers the side surfaces of each lead 44 except for the outer side surface 44S of the lead 44. The surface-processed layer 45, for example, entirely covers the side surfaces of the base 41 except for the outer side surface 44S of each lead 44.

In the present embodiment, the surface-processed layer 45 is an oxide film. The surface-processed layer 45 is, for example, a film of copper oxide containing a hydroxide. The surface-processed layer 45 is formed by, for example, fine needle crystals. The needle crystals have, for example, a grain size of approximately 0.5 μm or less. The oxide film serving as the surface-processed layer 45 is not a spontaneous oxide film. Rather, the oxide film is formed intentionally by performing an oxidation process on the heat dissipating plate 40. For example, the oxide film serving as the surface-processed layer 45 is formed by performing an anode oxidation process on the heat dissipating plate 40. Such an oxide film is formed by oxidizing the base material (e.g., Cu) of the heat dissipating plate 40.

Figure 1B:
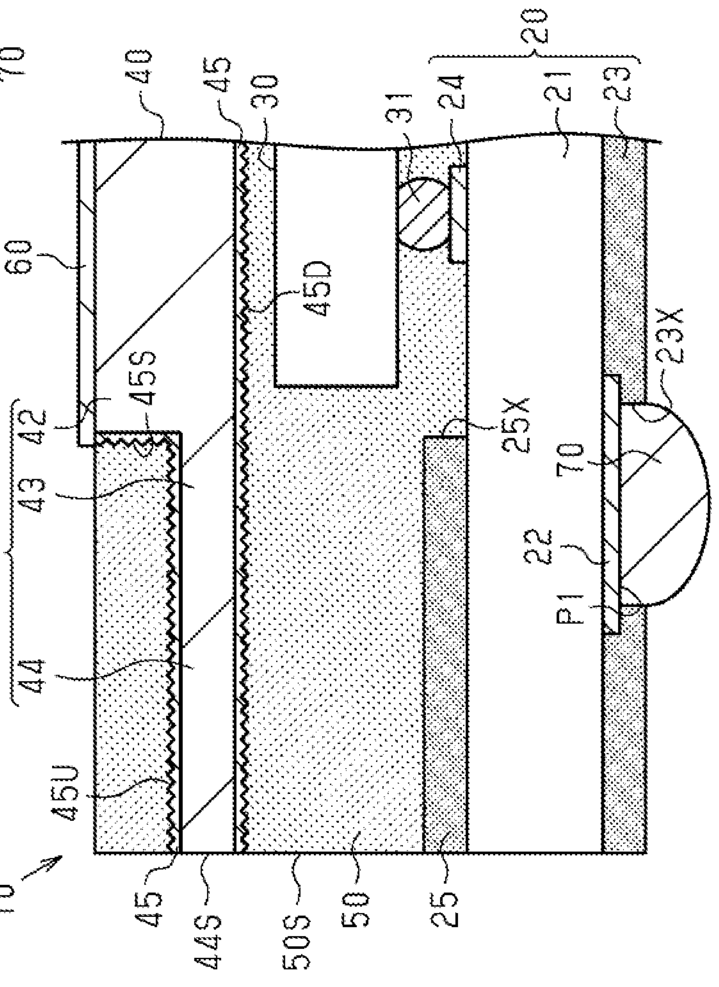
FIG. 1B is a partially enlarged cross-sectional view of the semiconductor device illustrated in FIG. 1A.

As illustrated in FIG. 1B, the surface-processed layer 45 has a rough surface. The surface of the surface-processed layer 45 has, for example, a surface roughness that is greater than that of the main body 42. In the present example, the part of the surface-processed layer 45 that covers the lower surface of the base 41 defines a lower surface 45D. The lower surface 45D has a greater surface roughness than the lower surface of the main body 42. The part of the surface-processed layer 45 that covers the upper surfaces of the projection 43 and the leads 44 defines an upper surface 45U. The upper surface 45U has a greater surface roughness than the upper surfaces of the projection 43 and the leads 44. Further, the part of the surface-processed layer 45 covering the side surfaces of the main body 42 and the projection 43 define side surfaces 45S. The side surfaces 45S have a greater surface roughness than the side surfaces of the main body 42 and the projection 43. The surface roughness (Ra value) of the lower surface 45D, the upper surface 45U, and the side surfaces 45S of the surface-processed layer 45 may be, for example, 200 nm or greater. The Ra value of the surface roughness, expressed by a numerical value indicating the surface roughness, is also referred to as arithmetic mean roughness that is the arithmetic means of measurements of vertical deviations of a surface profile from a mean line within a measurement region. The surface-processed layer 45 has a thickness set in, for example, the range from 0.1 μm to 0.2 μm, inclusive.

The surface-processed layer 45, which is an oxide layer, is not formed on the outer side surface 44S of each lead 44. Nevertheless, an oxide film that differs from the surface-processed layer 45, for example, a spontaneous oxide film may be formed on the outer side surface 44S of each lead 44. The spontaneous oxide film, for example, does not contain a hydroxide.

Structure of Encapsulation Resin 50

As illustrated in FIG. 1A, the encapsulation resin 50 encapsulates the semiconductor element 30 and fills the space between the wiring substrate 20 and the heat dissipating plate 40. The encapsulation resin 50 is formed on the upper surface of the substrate body 21. The encapsulation resin 50, for example, entirely covers the semiconductor element 30 including the connection terminals 31. The encapsulation resin 50, for example, covers the entire surface of the semiconductor element 30. The encapsulation resin 50, for example, fills the space between the wiring substrate 20 and the semiconductor element 30. The encapsulation resin 50, for example, entirely covers the upper surface of the substrate body 21 and the wiring layer 24 that are exposed in the opening 25X of the solder resist layer 25.

The encapsulation resin 50 fills the space between the semiconductor element 30 and the heat dissipating plate 40. The interval between the back surface of the semiconductor element 30 and the lower surface of the heat dissipating plate 40, that is, the minimum distance between the back surface of the semiconductor element 30 and the lower surface of the surface-processed layer 45 is, for example, approximately 50 μm to 100 μm. The space between the back surface of the semiconductor element 30 and the lower surface of the heat dissipating plate 40, for example, includes only the encapsulation resin 50. In other words, the heat dissipating plate 40 is arranged above the semiconductor element 30 with only the encapsulation resin 50 located in between. The heat dissipating plate 40 is thermally coupled to the semiconductor element 30 by only the encapsulation resin 50. As illustrated in FIG. 1B, the encapsulation resin 50 filling the space between the semiconductor element 30 and the heat dissipating plate 40 entirely covers the lower surface 45D of the surface-processed layer 45, which covers the lower surface of the main body 42.

As illustrated in FIG. 1A, the encapsulation resin 50, for example, fills the space between the solder resist layer 25 and the heat dissipating plate 40. The space between the upper surface of the solder resist layer 25 and the lower surface of the heat dissipating plate 40 includes only the encapsulation resin 50 and does not include, for example, a spacer to maintain the interval between the wiring substrate 20 and the heat dissipating plate 40. Thus, in the region outside the mounting region of the semiconductor element 30, only the encapsulation resin 50 is arranged in the space between the wiring substrate 20 and the heat dissipating plate 40. In other words, the heat dissipating plate 40 is arranged above the wiring substrate 20 with only the encapsulation resin 50 arranged in between. The heat dissipating plate 40 is supported above the wiring substrate 20 by only the encapsulation resin 50. The encapsulation resin 50, for example, covers the entire upper surface of the solder resist layer 25.

The projection 43 and the leads 44 of the heat dissipating plate 40 are embedded in the encapsulation resin 50 at the peripheral region outside the mounting region of the semiconductor element 30. The encapsulation resin 50 covers the upper, lower, and side surfaces of the projection 43 and the upper, lower, and side surfaces of the leads 44. In the example of FIGS. 1A and 1B, the encapsulation resin 50 entirely covers the lower surface 45D of the surface-processed layer 45 that covers the lower surface of the projection 43, the upper surface 45U of the surface-processed layer 45 that covers the upper surface of the projection 43, and the side surfaces 45S of the surface-processed layer 45 that cover the side surfaces of the projection 43. The encapsulation resin 50 entirely covers the lower surface 45D of the surface-processed layer 45 that covers the lower surface of the leads 44, the upper surface 45U of the surface-processed layer 45 that covers the upper surface of the leads 44, and the side surfaces 45S of the surface-processed layer 45 that cover the side surfaces of the leads 44. Further, the encapsulation resin 50 entirely covers the side surfaces 45S of the surface-processed layer 45 that cover the side surfaces of the main body 42.

The encapsulation resin 50 exposes the upper surface of the main body 42. The upper surface of the encapsulation resin 50 is flush with the upper surface of the main body 42 or located at a slightly lower position than the upper surface of the main body 42. The outer side surface 44S of each lead 44 of the heat dissipating plate 40 is exposed from the outer side surface 50S of the encapsulation resin 50. The outer side surface 50S of the encapsulation resin 50 is, for example, flush with the outer side surface 44S of each lead 44, the outer side surface of the substrate body 21, and the outer side surfaces of the solder resist layers 23 and 25.

The encapsulation resin 50 fixes the heat dissipating plate 40 to the wiring substrate 20 and encapsulates the semiconductor element 30. Thus, the encapsulation resin 50 functions as a support that supports the heat dissipating plate 40 on the wiring substrate 20 and a protector that protects the semiconductor element 30. Further, the encapsulation resin 50 increases the mechanical strength of the entire semiconductor device 10. This allows the thickness of the wiring substrate 20 and the heat dissipating plate 40 to be reduced, which, in turn, allows the thickness of the entire semiconductor device 10 to be reduced.

The material of the encapsulation resin 50 may be, for example, a non-photosensitive insulative resin of which the main component is a thermosetting resin. The material of the encapsulation resin 50 may be, for example, an insulative resin such as epoxy resin and polyimide resin, or a resin material obtained by mixing such resins with a filler such as silica or alumina. The encapsulation resin 50 may be, for example, a mold resin.

Structure of Metal Layer 60

The metal layer 60 is formed on the upper surface of the main body 42, which is exposed from the encapsulation resin 50 and the surface-processed layer 45. The metal layer 60, for example, covers the entire upper surface of the main body 42. The metal layer 60, for example, functions as an exterior plating layer. Examples of the metal layer 60 include a Sn layer and a solder layer. The material of the solder layer may be, for example, an alloy including Pb, an alloy of Sn and Au, an alloy of Sn and Cu, an alloy of Sn and Ag, or an alloy of Sn, Ag, and Cu. The Sn layer and the solder layer are formed through, for example, an electrolytic plating process. Other examples of the metal layer 60 include an Ag layer, an Au layer, a Ni layer/Au layer, a Ni layer/Pd layer/Au layer, and a Ni layer/Ag layer. Instead of using the metal layer 60, for example, an anti-oxidation process such as an OSP process may be performed on the upper surface of the main body 42 to form an OSP film. The OSP film may be an organic coating of an azole compound or an imidazole compound.

Structure of External Connection Terminals 70

The external connection terminals 70 are formed on the external connection pads P1 of the wiring substrate 20. The external connection terminals 70 are, for example, connection terminals electrically connected to pads arranged on a mounting substrate such as a motherboard (not illustrated). The external connection terminals 70 may be, for example, solder balls or lead pins. In the present embodiment, the external connection terminals 70 are solder balls.

Method for Manufacturing Semiconductor Device 10

A method for manufacturing the semiconductor device 10 will now be described. To simplify illustration, elements that will consequently become the final elements of the semiconductor device 10 are given the same reference characters as the final elements.

Figure 5:
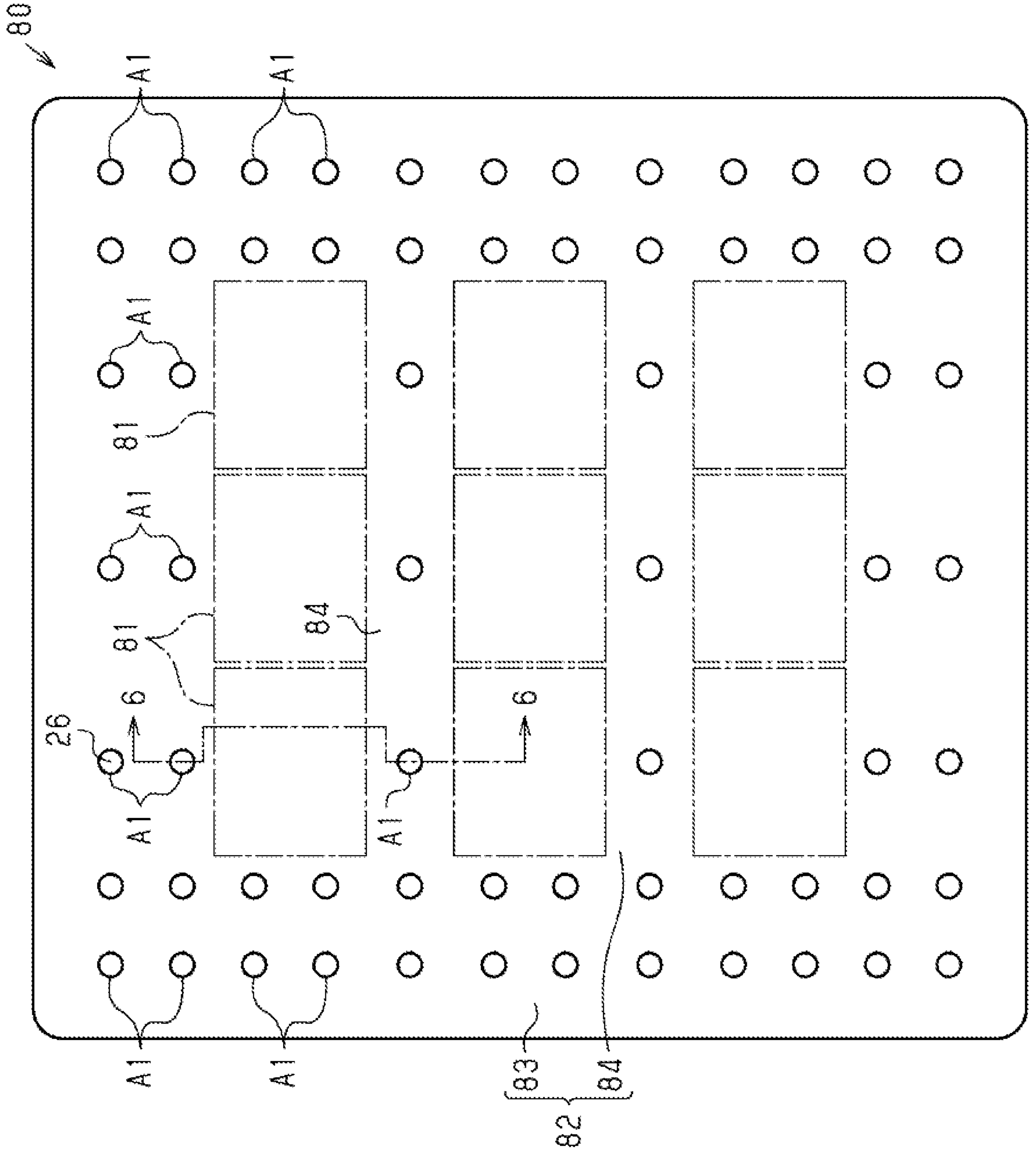
FIG. 5 is a schematic plan view of the semiconductor device illustrating a manufacturing method according to one embodiment.

First, in the step illustrated in FIG. 5, a relatively large first substrate 80 is prepared. The first substrate 80 includes first product regions 81 and a first non-product region 82. In the first substrate 80, for example, the first product regions 81 are arranged in an matrix-like array of three rows and three columns A structure corresponding to the wiring substrate 20 of FIG. 1A is formed in each of the first product regions 81. The first non-product region 82 surrounds the nine first product regions 81 in plan view. The first non-product region 82, for example, surrounds each of the nine first product regions 81 in plan view. The first non-product region 82 includes, for example, a first peripheral region 83 that collectively surrounds the nine first product regions 81 and first joining regions 84 that are each located between two adjacent ones of the first product regions 81 in the vertical direction as viewed in FIG. 5. The first joining regions 84 each extend in the lateral direction as viewed in FIG. 5.

Subsequent to the formation of the structure corresponding to the semiconductor device 10 illustrated in FIG. 1A in each of the first product regions 81, the first substrate 80 is cut along cutting lines, which are indicated by the single-dashed lines, and fragmented into separate semiconductor devices 10. Thus, the portion outside the first product regions 81, namely, the first non-product region 82, is consequently disposed of. In other words, the first non-product region 82 is the portion that will consequently be removed from the fragmented semiconductor devices 10. Although the first substrate 80 includes nine first product regions 81 in the example illustrated in FIG. 5, there is no limitation to the quantity of the first product regions 81. For the sake of brevity, the description hereafter will focus on a single first product region 81 and the first non-product region 82 surrounding the first product region 81.

Figure 6:
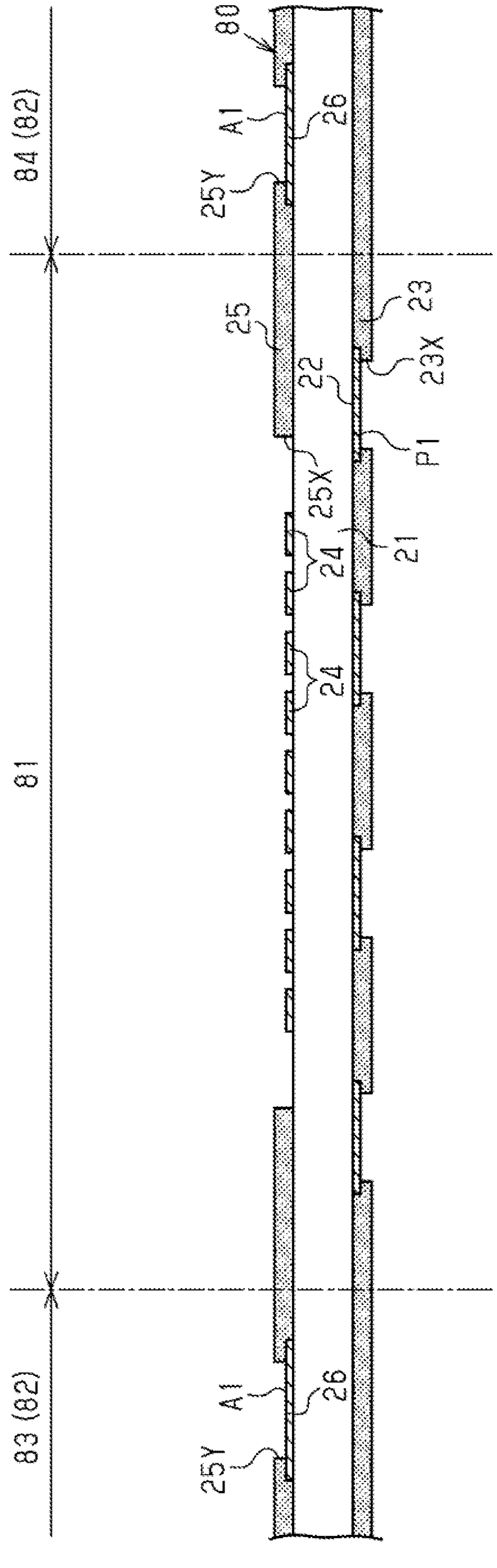
FIG. 6 is a cross-sectional view taken along line 6-6 in FIG. 5.

As illustrated in FIG. 6, each first product region 81 of the first substrate 80 includes the substrate body 21, the wiring layer 22, which is stacked on the lower surface of the substrate body 21, the solder resist layer 23, which is stacked on the lower surface of the substrate body 21, the wiring layer 24, which is stacked on the upper surface of the substrate body 21, and the solder resist layer 25, which is stacked on the upper surface of the substrate body 21. In this state, a wiring layer 26 is formed on the upper surface of the substrate body 21 in the first non-product region 82 of the first substrate 80. The solder resist layer 25 in the first non-product region 82 includes openings 25Y exposing parts of the upper surface of the wiring layer 26 as first connecting portions A1. As illustrated in FIG. 5, for example, lines of the first connecting portions A1 are arranged in a peripheral manner in the first peripheral region 83 of the first non-product region 82. In the example of FIG. 5, the lines of the first connecting portions A1 in the first peripheral region 83 are arranged along the edges of the first substrate 80. Further, the first connecting portions A1 are arranged in the first joining regions 84 of the first non-product region 82. The first connecting portions A1 in the first joining regions 84 are arranged between two adjacent ones of the first product regions 81 in the vertical direction as viewed in FIG. 5.

Figure 7:
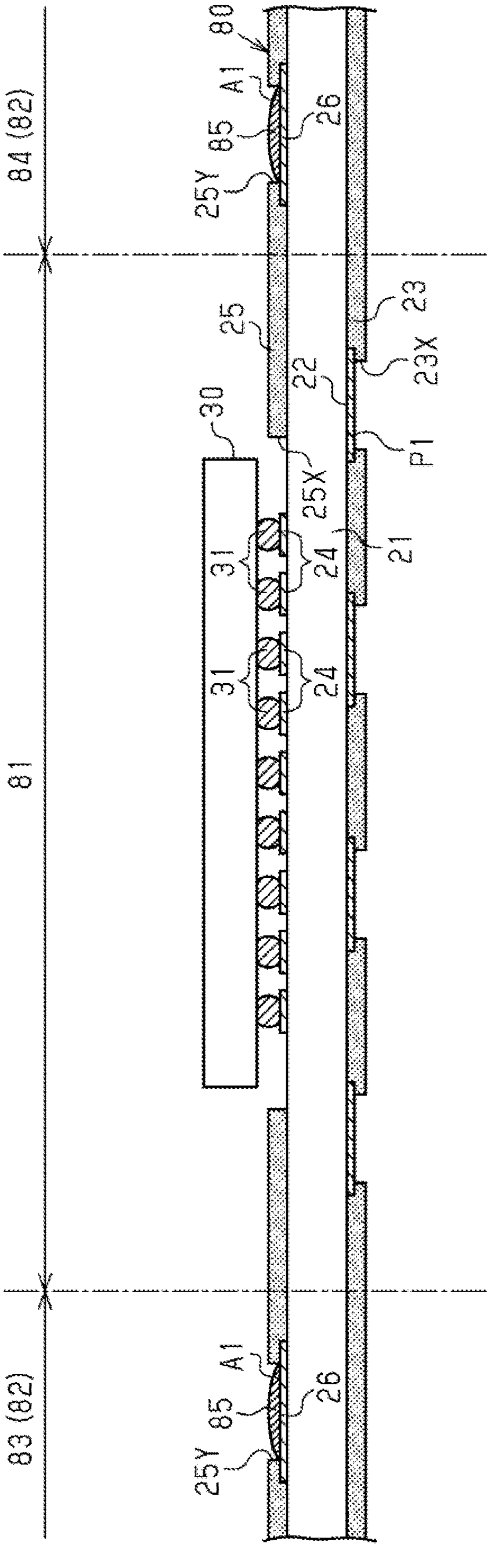
FIG. 7 is a schematic cross-sectional view of the semiconductor device illustrating a manufacturing step.

Then, in the step illustrated in FIG. 7, a solder layer 85 is formed on the upper surface of wiring layer 26 exposed from each opening 25Y of the solder resist layer 25, that is, on the first connecting portion A1. For example, screen printing or the like is performed to apply a paste to the first connecting portions Al to form the solder layer 85.

In the step illustrated in FIG. 7, the semiconductor element 30 is prepared. The circuit formation surface (lower surface) of the semiconductor element 30 includes the connection terminals 31. Then, the semiconductor element 30 is mounted on the upper surface of the wiring layer 24 in the first product region 81. For example, the connection terminals 31 of the semiconductor element 30 are flip-chip bonded to the wiring layer 24 in the first product region 81. For example, when the connection terminals 31 are solder bumps, flux (not illustrate) is applied to the wiring layer 24. Further, the wiring layer 24 is aligned with the connection terminals 31. Then, a reflow process is performed at a temperature of approximately 230°° C. to 260° C. This melts the connection terminals 31, which are solder bumps, and electrically connects the connection terminals 31 to the wiring layer 24. Although not illustrated in the drawings, an underfill resin may be arranged between the semiconductor element 30 and the substrate body 21.

Figure 8:
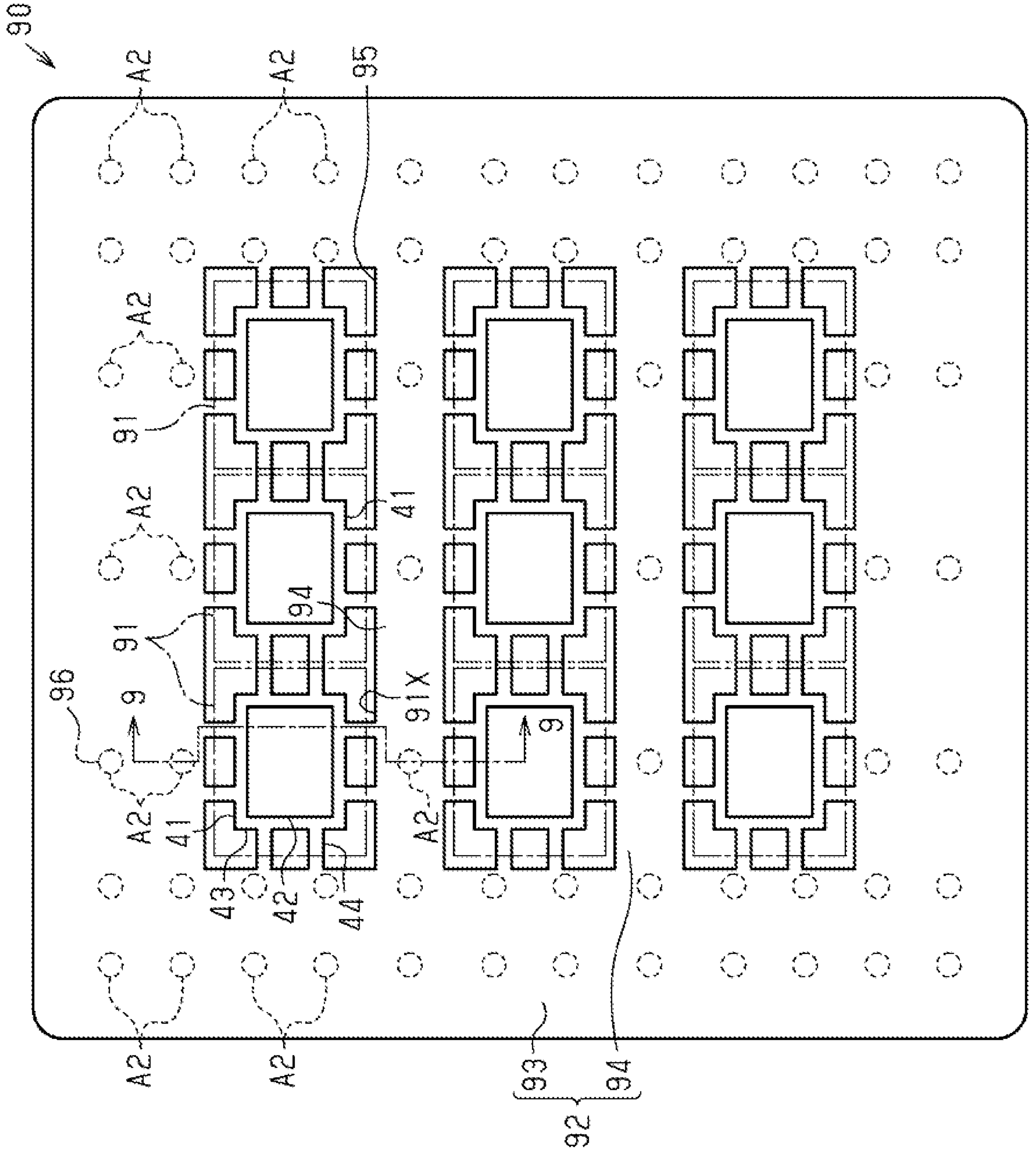
FIG. 8 is a schematic plan view of the semiconductor device illustrating a manufacturing step.

Then, in the step illustrated in FIG. 8, a relatively large second substrate 90 is prepared. The second substrate 90 is, for example, a metal plate. In the present embodiment, the second substrate 90 is a copper plate. The second substrate 90 includes second product regions 91 and a second non-product region 92. In the second substrate 90, for example, the second product regions 91 are arranged in a matrix-like array of three rows and three columns. A structure corresponding to the heat dissipating plate 40 illustrated in FIG. 1A is formed in each of the second product regions 91. The second non-product region 92 surrounds the nine second product regions 91. The second non-product region 92, for example, surrounds each of the nine second product regions 91 in plan view. The second non-product region 92 includes, for example, a second peripheral region 93 that collectively surrounds the nine second product regions 91 and second joining regions 94 that are each located between two adjacent ones of the second product regions 91 in the vertical direction as viewed in FIG. 8. The second joining regions 94 each extend in the lateral direction as viewed in FIG. 8.

Subsequent to the formation of the structure corresponding to the semiconductor device 10 illustrated in FIG. 1A in each of the second product regions 91, the second substrate 90 is cut along cutting lines, which are indicated by the single-dashed lines, and fragmented into separate semiconductor devices 10. Thus, the portion outside the second product regions 91, namely, the second non-product region 92, is consequently disposed of. In other words, the second non-product region 92 is the portion that will consequently be removed from the fragmented semiconductor devices 10. Although the second substrate 90 includes nine second product regions 91 in the example illustrated in FIG. 8, there is no limitation to the quantity of the second product regions 91. For the sake of brevity, the description hereafter will focus on a single second product region 91 and the second non-product region 92 surrounding the second product region 91.

Figure 9:
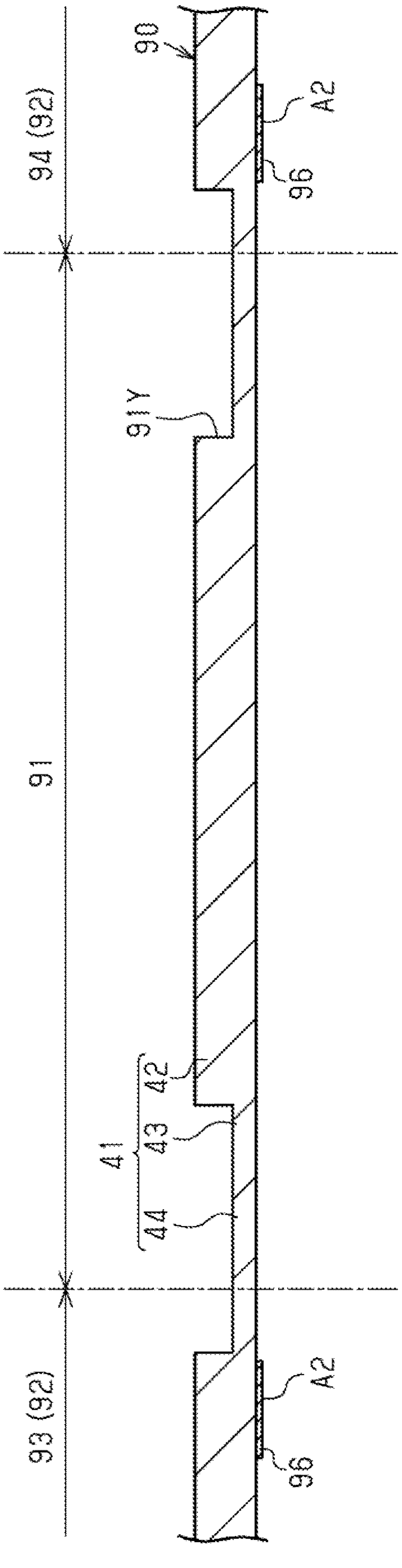
FIG. 9 is a cross-sectional view taken along line 9-9 in FIG. 8.

As illustrated in FIGS. 8 and 9, the base 41 including the main body 42, the projection 43, and the leads 44 is formed in each second product region 91 of the second substrate 90. As illustrated in FIG. 8, openings 91X are formed in each of the second product regions 91 to define the main body 42, the projection 43, and the leads 44. As illustrated in FIG. 9, recesses 91Y are formed in each of the second product regions 91 at portions of the base 41 corresponding to the projection 43 and the leads 44. Thus, in the present example, the projection 43 and the leads 44 are obtained by reducing the thickness of the base 41 from its upper surface. The openings 91X and the recesses 91Y described above are formed through, for example, an etching process or a pressing process.

As illustrated in FIG. 8, a joining portion 95 connecting the leads 44 of two adjacent ones of the second product regions 91 in the vertical direction as viewed in FIG. 8 is formed in the second joining regions 94 of the second non-product region 92. In other words, the leads 44 formed in each of the second product regions 91 are connected by the joining portion 95 to the leads 44 formed in the adjacent one of the second product regions 91 in the vertical direction as viewed in FIG. 8. Further, the leads 44 formed in each of the second product regions 91 are, for example, directly connected to the leads 44 formed in the adjacent one of the second product regions 91 in the lateral direction as viewed in FIG. 8.

In the step illustrated in FIG. 9, a metal layer 96 is formed on the lower surface of the second substrate 90 in the second non-product region 92. In the present example, the metal layer 96 is formed on parts of the lower surface of the second substrate 90 in the second non-product region 92. The metal layer 96 may be formed, for example, through an electrolytic plating process that uses the second substrate 90 as a power feeding layer. For example, a resist layer is formed on the entire surface of the second substrate 90 except for the formation regions of the metal layer 96. Then, an electrolytic plating process is performed using the resist layer as a plating mask to form the metal layer 96 on the second substrate 90 where the second substrate 90 is exposed from the resist layer. The metal layer 96 may also be formed through a sparger process. The metal layer 96 may be an Ag layer, an Au layer, a Ni layer, a Ni layer/Au layer, a Ni layer/Pd layer/Au layer, or a Ni layer/Ag layer. In the present embodiment, the outermost layer of the metal layer 96 is, for example, a noble metal plating layer of an Au layer, an Ag layer, a Pd layer, or the like. The outermost layer of the metal layer 96, that is, the lower surface of the metal layer 96, functions as second connecting portions A2 that are connected to the first connecting portions A1 of the first substrate 80 illustrated in FIG. 7. The second connecting portions A2 are respectively arranged in correspondence with the first connecting portions A1.

As illustrated in FIG. 8, for example, lines of second connecting portions A2 are arranged in a peripheral manner in the second peripheral region 93 of the second non-product region 92. In other words, the lines of the second connecting portions A2 in the second peripheral region 93 are arranged along the edges of the second substrate 90. Further, the second connecting portions A2 are arranged in the joining portions 95 of the second joining regions 94. The second connecting portions A2 in the joining portion 95 are arranged between two adjacent ones of the second product regions 91 in the vertical direction as viewed in FIG. 8.

Figure 10:
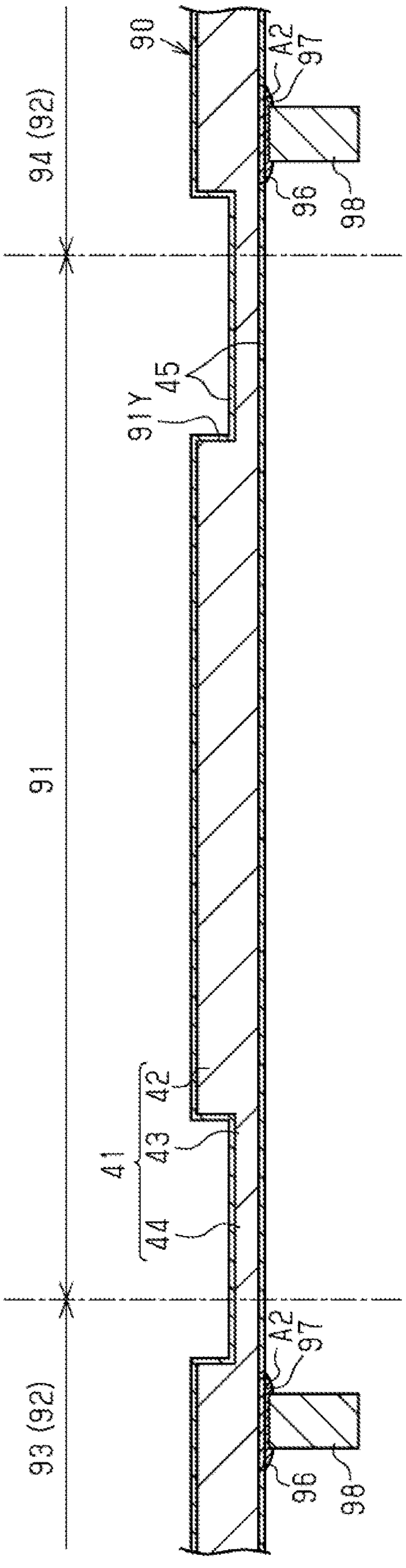
FIG. 10 is a schematic cross-sectional view of the semiconductor device illustrating a manufacturing step.

Then, in the step illustrated in FIG. 10, the surface-processed layer 45 is formed on the surfaces of the second substrate 90 surrounding the metal layer 96. In the present embodiment, the surface-processed layer 45 is an oxide film. The surface-processed layer 45 may be formed, for example, through an anodic oxidation process. The anodic oxidation process is, for example, a process in which the second substrate 90, prior to the formation of the surface-processed layer 45, is used as an anode, and immersed in an anode oxidation liquid, which is an electrolyte. Then, an electrode of platinum (Pt) or the like used as a cathode is energized facing the second substrate 90. This applies pulse voltage to the electrolyte. The anodic oxidation process forms the surface-processed layer 45, which is an oxide film, on the entire surface of the second substrate 90. In this case, however, the metal layer 96 will not undergo anodic oxidation because it is a noble metal plating layer. Thus, the surface-processed layer 45 is formed on the entire surface of the second substrate 90 except for portions covered by the metal layer 96 so as to surround the metal layer 96. The surface-processed layer 45 is a copper oxide film containing a hydroxide and is an anodic oxide film including needle crystals. Thus, the surface of the surface-processed layer 45 is rough. In the anodic oxidation process, the thickness of the surface-processed layer 45 may be adjusted by adjusting processing conditions such as the voltage, the processing time, and the composition of the anodic oxidation liquid. The anodic oxidation process allows the thickness of the surface-processed layer 45 to be easily adjusted to a given thickness, which is in the range of 0.1 μm to 0.2 μm in this example. In other words, the anodic oxidation process allows the surface-processed layer 45 to be stably formed with a given thickness of 0.1 μm to 0.2 μm.

Then, a solder layer 97 is formed on the lower surface of the metal layer 96, that is, on the second connecting portions A2. For example, screen printing or the like is performed to apply a paste to the second connecting portions A2 to form the solder layer 97. Then, rod-shaped metal posts 98 are mounted on (bonded to) the second connecting portions A2. For example, the metal posts 98 are mounted on the solder layer 97, and a reflow process is performed at a predetermined temperature to melt the solder layer 97 and fix the metal posts 98 to the second connecting portions A2. The outermost layer of the metal layer 96 is a noble metal plating layer. This allows the solder to be wet-spread in a preferred manner on the metal layer 96. The material of the metal posts 98 may be, for example, copper or a copper alloy.

The paste applied to the second connecting portions A2 when forming the solder layer 97 contains flux. The flux functions to reduce and remove spontaneous oxide film on the metal layer surface and obtains a solder wetting property. Thus, when forming the surface-processed layer 45, which is an oxide film, around the metal layer 96, the flux around the metal layer 96 will reduce the surface-processed layer 45 formed around the metal layer 96. This reduces the activity of flux in the surface-processed layer 45. As a result, the surface-processed layer 45 will not have solder wettability, and wet spreading of solder will be limited. Thus, the surface-processed layer 45 functions to limit the spreading of solder. When, however, the surface-processed layer 45 is too thin, for example, when the thickness of the surface-processed layer 45 is less than 0.1 μm, the activity of flux will not be reduced substantially. Thus, the spreading of solder may not be limited in a preferred manner in such a case. When the surface-processed layer 45 is too thick, for example, when the thickness of the surface-processed layer 45 is greater than 0.2 μm, the occurrence of delamination may increase inside the surface-processed layer 45. The occurrence of delamination inside the surface-processed layer 45 will lower adhesion of the second substrate 90 with the encapsulation resin 50, which is formed in a subsequent step. Accordingly, in the present embodiment, the thickness of the surface-processed layer 45 is set in the range of 0.1 μm to 0.2 μm.

Figure 11:
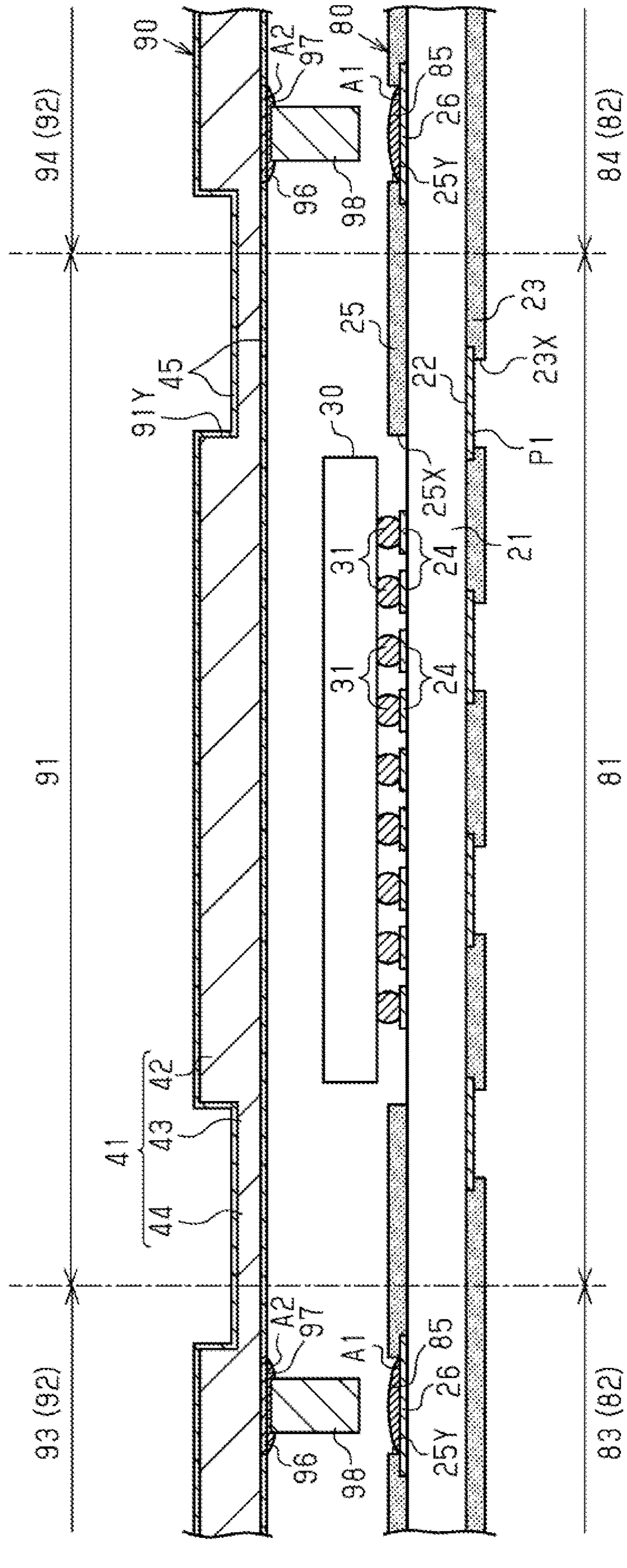
FIG. 11 is a schematic cross-sectional view of the semiconductor device illustrating a manufacturing step.

Then, in the step illustrated in FIG. 11, the second substrate 90 is arranged above the first substrate 80. The first substrate 80 and the second substrate 90 are arranged so that the first product regions 81 overlap the second product regions 91 in plan view. Thus, the first substrate 80 and the second substrate 90 are arranged so as to align the first product regions 81 and the second product regions 91 in the vertical direction. Further, the first substrate 80 and the second substrate 90 are arranged so that the first connecting portions A1 of the first substrate 80 face the second connecting portions A2 and the metal posts 98 of the second substrate 90.

Figure 12:
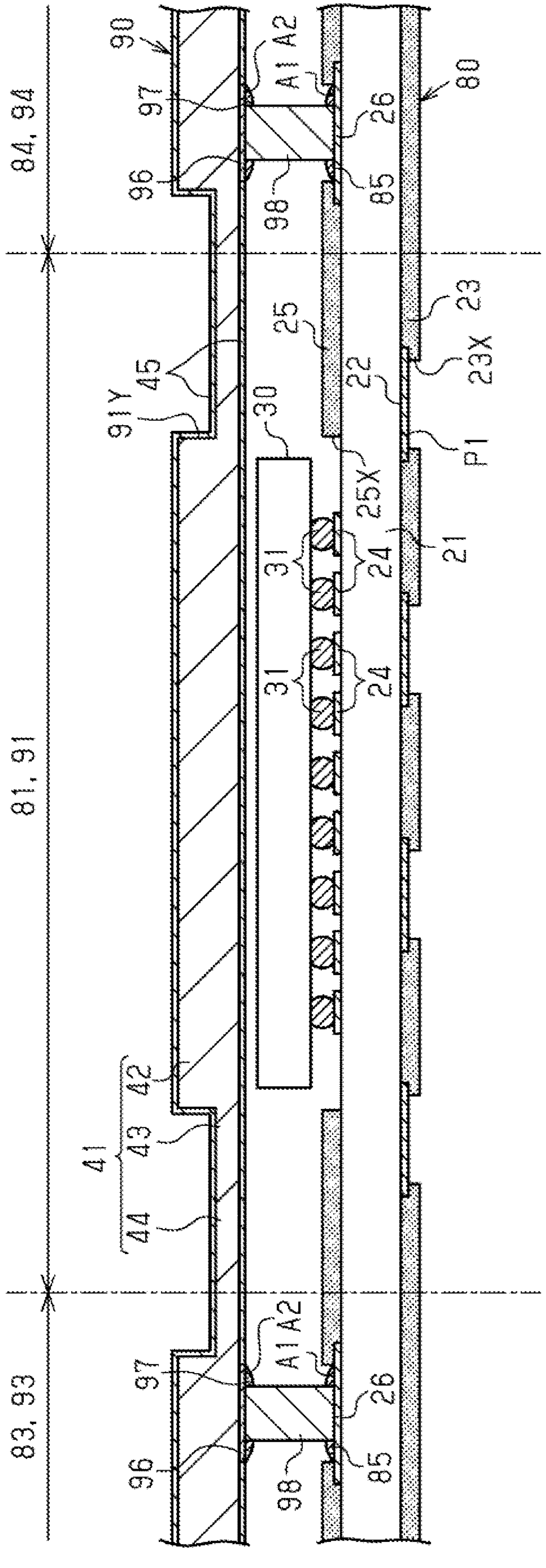
FIG. 12 is a schematic cross-sectional view of the semiconductor device illustrating a manufacturing step.

Then, in the step illustrated in FIG. 12, the first connecting portions A1 and the second connecting portions A2 are connected with the metal posts 98, and the second substrate 90 is mounted on the first substrate 80. For example, flux is applied to the solder layer 85 of the first substrate 80. Then, the second substrate 90 is arranged above the first substrate 80 with the metal posts 98 arranged in between. The first substrate 80 and the second substrate 90 arranged one above the other are pressed and heated at a temperature of approximately 230°° C. to 260° C. This melts the solder layers 85 and 97 and bonds the metal posts 98 to the first connecting portions A1 and the second connecting portions A2. In this step, the second substrate 90 is fixed to the first substrate 80 by the metal posts 98, and the first connecting portions A1 are electrically connected to the second connecting portions A2 by the metal posts 98. In this step, a reflow process is performed while pressing the second substrate 90 toward the first substrate 80 with the metal posts 98 functioning as spacers. This allows the interval between the first substrate 80 and the second substrate 90 to be maintained at a predetermined distance.

Figure 13:
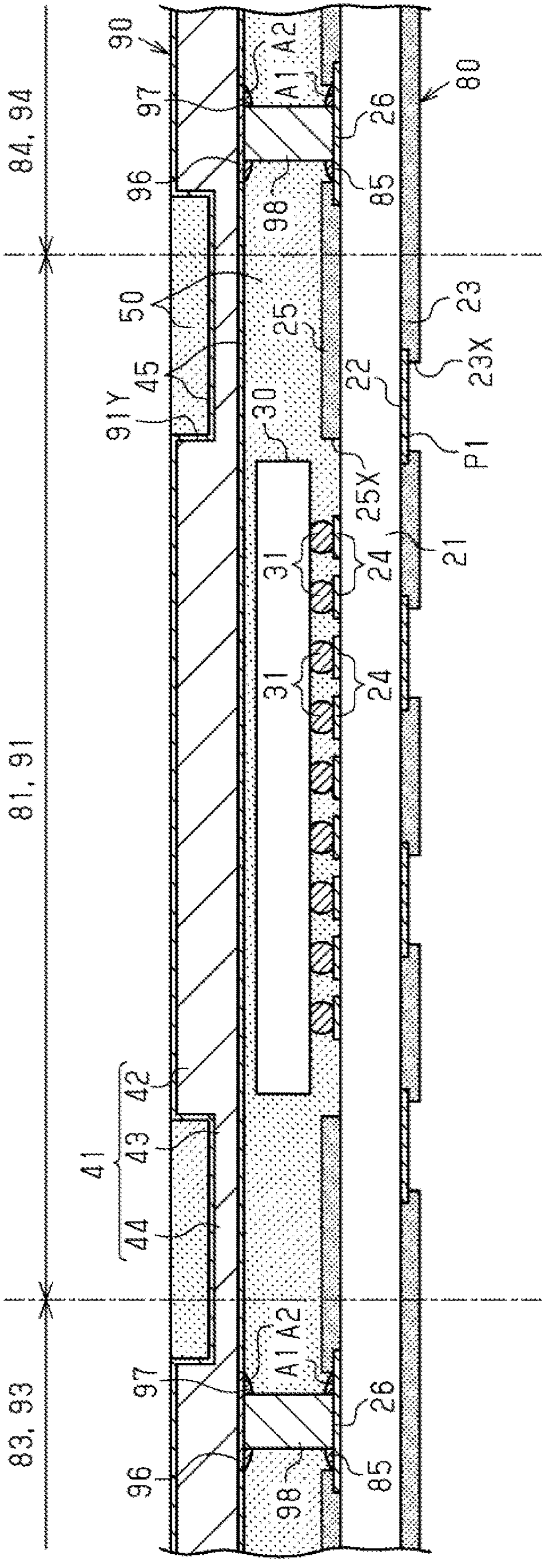
FIG. 13 is a schematic cross-sectional view of the semiconductor device illustrating a manufacturing step.

In the step illustrated in FIG. 13, the encapsulation resin 50 is formed filling the space between the first substrate 80, the second substrate 90, and the semiconductor element 30. The encapsulation resin 50 fills the space between the first substrate 80 and the second substrate 90, the space between the first substrate 80 and the semiconductor element 30, and the space between the semiconductor element 30 and the second substrate 90. Further, the encapsulation resin 50 fills the openings 91X and the recesses 91Y illustrated in FIG. 8 and entirely covers the semiconductor element 30. The encapsulation resin 50, for example, exposes the upper surface of the main body 42 and the upper surface of the surface-processed layer 45 that covers the upper surface of the main body 42. The encapsulation resin 50 may be formed, for example, through a resin molding process. For example, when a thermosetting mold resin is used as the material of the encapsulation resin 50, the structure illustrated in FIG. 12 is arranged in a mold. Then, the mold resin is fluidized and injected into the mold under a pressure (e.g., 5 MPa to 10 MPa). The mold resin is heated at a temperature of 180°° C. and hardened to form the encapsulation resin 50. After the encapsulation process is completed, the structure, on which the encapsulation resin 50 is formed, is removed from the mold. The process for filling the mold with the mold resin may be, for example, a transfer molding, a compression molding, injection molding, or the like.

Figure 14:
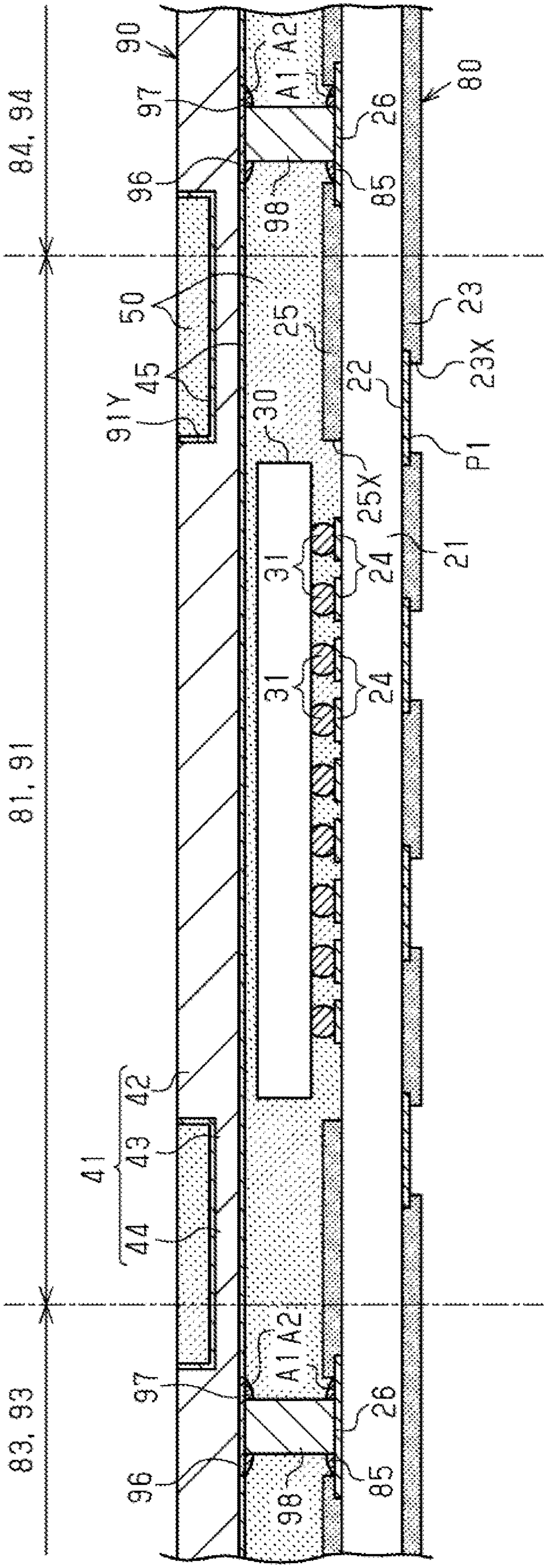
FIG. 14 is a schematic cross-sectional view of the semiconductor device illustrating a manufacturing step.

Then, in the step illustrated in FIG. 14, the upper surface of the surface-processed layer 45 and the upper surface of the encapsulation resin 50 are polished so that the upper surface of the main body 42 is exposed to the exterior. For example, the upper surface of the surface-processed layer 45 and the upper surface of the encapsulation resin 50 are polished so that the upper surface of the main body 42 becomes flush with the upper surface of the encapsulation resin 50. The surface-processed layer 45 and the encapsulation resin 50 are polished through buffing and blasting.

Figure 15:
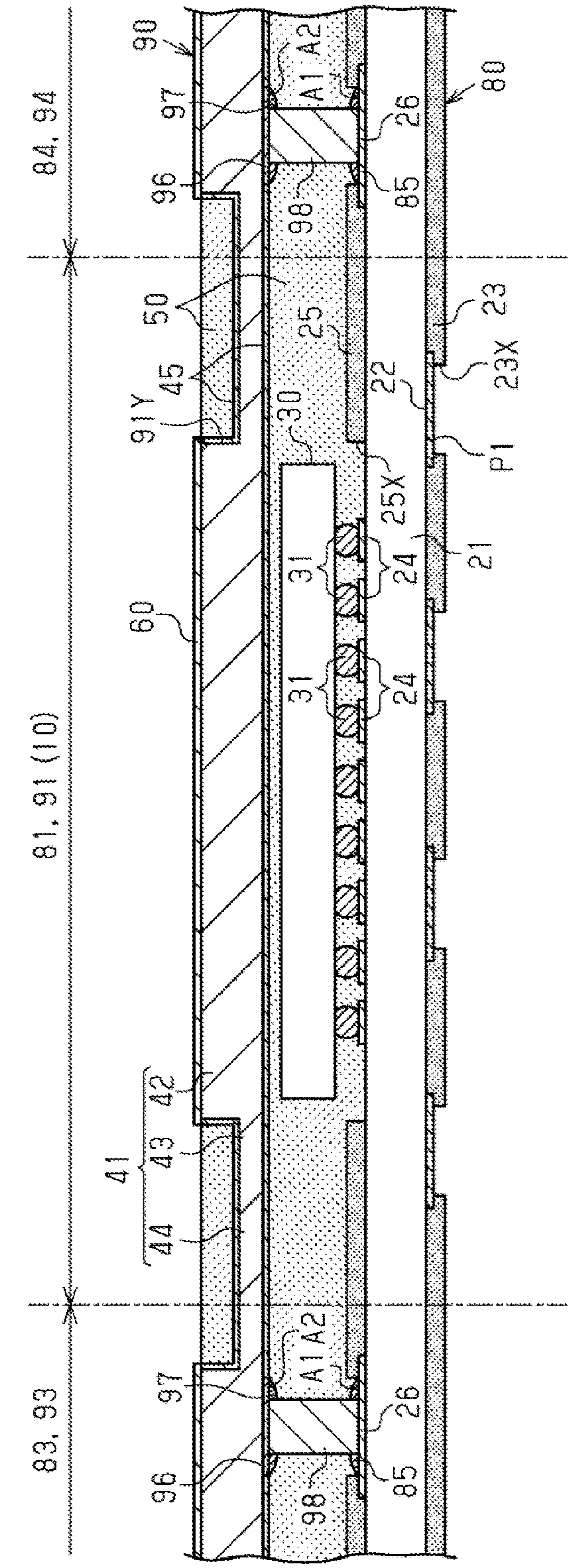
FIG. 15 is a schematic cross-sectional view of the semiconductor device illustrating a manufacturing step.

In the step illustrated in FIG. 15, the metal layer 60 is formed on the upper surface of the main body 42 exposed from the surface-processed layer 45 and the encapsulation resin 50. The metal layer 60 may be formed, for example, through an electrolytic plating process that uses the second substrate 90 as a power feeding layer.

A structure corresponding to the semiconductor device 10 is formed in each of the first product regions 81 and the corresponding second product regions 91 through the manufacturing steps described above.

Figure 16:
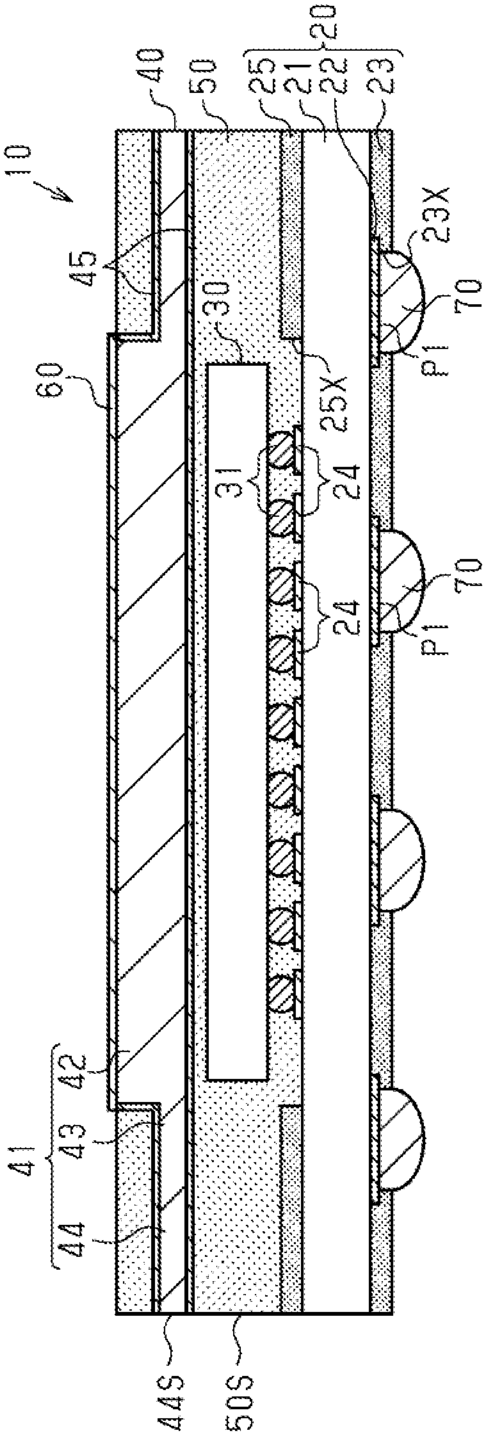
FIG. 16 is a schematic cross-sectional view of the semiconductor device illustrating a manufacturing step.

Then, the first substrate 80, the second substrate 90, and the encapsulation resin 50 are cut with a dicing saw or the like along cutting lines, which are indicated by the single-dashed lines in FIG. 15, that is, along the edges of the first product regions 81 and the edges of the second product regions 91, and fragmented into separate semiconductor devices 10. In this step, as illustrated in FIG. 16, the cut surfaces, namely, the outer side surface 44S of the lead 44, the outer side surface 50S of the encapsulation resin 50, and the outer side surface of the substrate body 21 are flush with one another. Further, this step removes the first non-product region 82 and the second non-product region 92 including the metal posts 98 illustrated in FIG. 15.

A batch of the semiconductor devices 10 is manufactured through the manufacturing steps described above. Subsequent to fragmentation, the semiconductor device 10 may be used in a state reversed upside down or arranged at any angle.

The present embodiment has the advantages described below.

(1) The semiconductor device 10 includes the wiring substrate 20, the semiconductor element 30 mounted on the wiring substrate 20, and the heat dissipating plate 40 arranged above the semiconductor element 30. The semiconductor device 10 includes the encapsulation resin 50 that encapsulates the semiconductor element 30 and fills the space between the wiring substrate 20 and the heat dissipating plate 40 and the space between the semiconductor element 30 and the heat dissipating plate 40. The heat dissipating plate 40 includes the main body 42, which overlaps the semiconductor element 30 in plan view, and the leads 44, which project outward from the main body 42. The leads 44 are thinner than the main body 42. The upper surface of each lead 44 is covered by the encapsulation resin 50. The outer side surface 44S of each lead 44 located at the outer edge of the semiconductor device 10 is exposed from the outer side surface 50S of the encapsulation resin 50. The upper surface of the main body 42 is exposed from the upper surface of the encapsulation resin 50.

With this structure, the upper and lower surfaces of the leads 44 are covered by the encapsulation resin 50. This embeds the leads 44 in the encapsulation resin 50. Thus, an anchor effect is produced that improves the adhesion of the leads 44 to the encapsulation resin 50. Accordingly, delamination of the heat dissipating plate 40, which include the leads 44, from the encapsulation resin 50 is limited. This allows the heat dissipation performance of the semiconductor device 10 to be maintained.

(2) Further, the leads 44 are embedded in the encapsulation resin 50. This reduces warping of the heat dissipating plate 40 that includes the leads 44. Thus, delamination of the heat dissipating plate 40 from the encapsulation resin 50 that would be caused by warping is limited.

(3) The upper surface of the main body 42 is exposed from the encapsulation resin 50. With this structure, the heat generated by the semiconductor element 30 is transferred through the encapsulation resin 50 to the heat dissipating plate 40 and released into the atmosphere from the upper surface of the main body 42 of the heat dissipating plate 40. This dissipates the heat generated by the semiconductor element 30 more efficiently than when the upper surface of the main body 42 is covered by the encapsulation resin 50.

(4) The outer side surface 44S of each lead 44 is exposed from the encapsulation resin 50. With this structure, the heat generated by the semiconductor element 30 is transferred through the encapsulation resin 50 to the heat dissipating plate 40 and released into the atmosphere from the outer side surface 44S of each lead 44 of the heat dissipating plate 40. This dissipates the heat generated by the semiconductor element 30 more efficiently than when the outer side surface 44S of each lead 44 is covered by the encapsulation resin 50.

(5) The heat dissipating plate 40 includes the projection 43 that projects from the side surface of the main body 42 toward the outer edge of the semiconductor device 10. The projection 43 surrounds the main body 42 in plan view. The projection 43 is thinner than the main body 42. The encapsulation resin 50 covers the upper surface and the side surfaces of the projection 43.

With this structure, the upper surface, the lower surface, and the side surfaces of the projection 43 are covered by the encapsulation resin 50. This embeds the projection 43, which surrounds the main body 42, in the encapsulation resin 50. Thus, an anchor effect is produced that improves the adhesion of the projection 43 and the encapsulation resin 50. Accordingly, delamination of the heat dissipating plate 40, which includes the projection 43, from the encapsulation resin 50 is limited. This allows the heat dissipation performance of the semiconductor device 10 to be maintained.

(6) The lower surface 45D of the surface-processed layer 45, which contacts the encapsulation resin 50, is rough. Thus, an anchor effect is produced that improves the adhesion of the heat dissipating plate 40 and the encapsulation resin 50. This limits delamination of the heat dissipating plate 40 from the encapsulation resin 50.

(7) The surface-processed layer 45 is an oxide film. With this structure, when the solder layer 97 and the metal posts 98 connect the first substrate 80 and the second substrate 90, the surface-processed layer 45 (oxide film) on the surface of the second substrate 90 reduces the activity of flux. This limits wet spreading of the solder layer 97 on the surface-processed layer 45, and thus limits wet spreading of the solder layer 97 at parts other than the second connecting portions A2.

(8) The heat dissipating plate 40 is supported above the wiring substrate 20 by only the encapsulation resin 50. In other words, the semiconductor device 10 includes no connecting members (spacers), such as the metal posts 98, connecting the heat dissipating plate 40 and the wiring substrate 20. This allows the semiconductor device 10 to be reduced in size as compared with when a connecting member is included.

(9) The metal posts 98, which are connecting members connecting the first substrate 80 and the second substrate 90, are arranged in the first non-product region 82, which is located at the outer side of the first product regions 81, and the second non-product region 92, which is located at the outer side of the second product regions 91. The encapsulation resin 50, which encapsulates the semiconductor element 30, fills the space between the first substrate 80 and the second substrate 90 and the space between the semiconductor element 30 and the second substrate 90 in a state where the first substrate 80 and the second substrate 90 are connected by the metal posts 98.

With this structure, the encapsulation resin 50 is formed with the first substrate 80 and the second substrate 90 spaced apart over a given distance by the metal posts 98. Thus, subsequent to fragmentation, the wiring substrate 20 and the heat dissipating plate 40 will be spaced apart by the given distance in the semiconductor device 10. Further, subsequent to fragmentation, the semiconductor element 30 and the heat dissipating plate 40 will be spaced apart by a given distance in the semiconductor device 10. In addition, subsequent to fragmentation, the semiconductor device 10 will not include the metal posts 98. This allows the semiconductor device 10 to be reduced in size.

(10) The first substrate 80 and the second substrate 90 are connected by the metal posts 98. With this structure, the connecting members connecting the first substrate 80 and the second substrate 90, namely, the metal posts 98, may have a smaller size in the planar direction than when using solder balls to connect the first substrate 80 and the second substrate 90.

Other Embodiments

The above embodiment may be modified as described below. The above embodiment and the modified examples described below may be combined as long as there is no technical contradiction.

The structure of the heat dissipating plate 40 may be changed.

Figure 17:
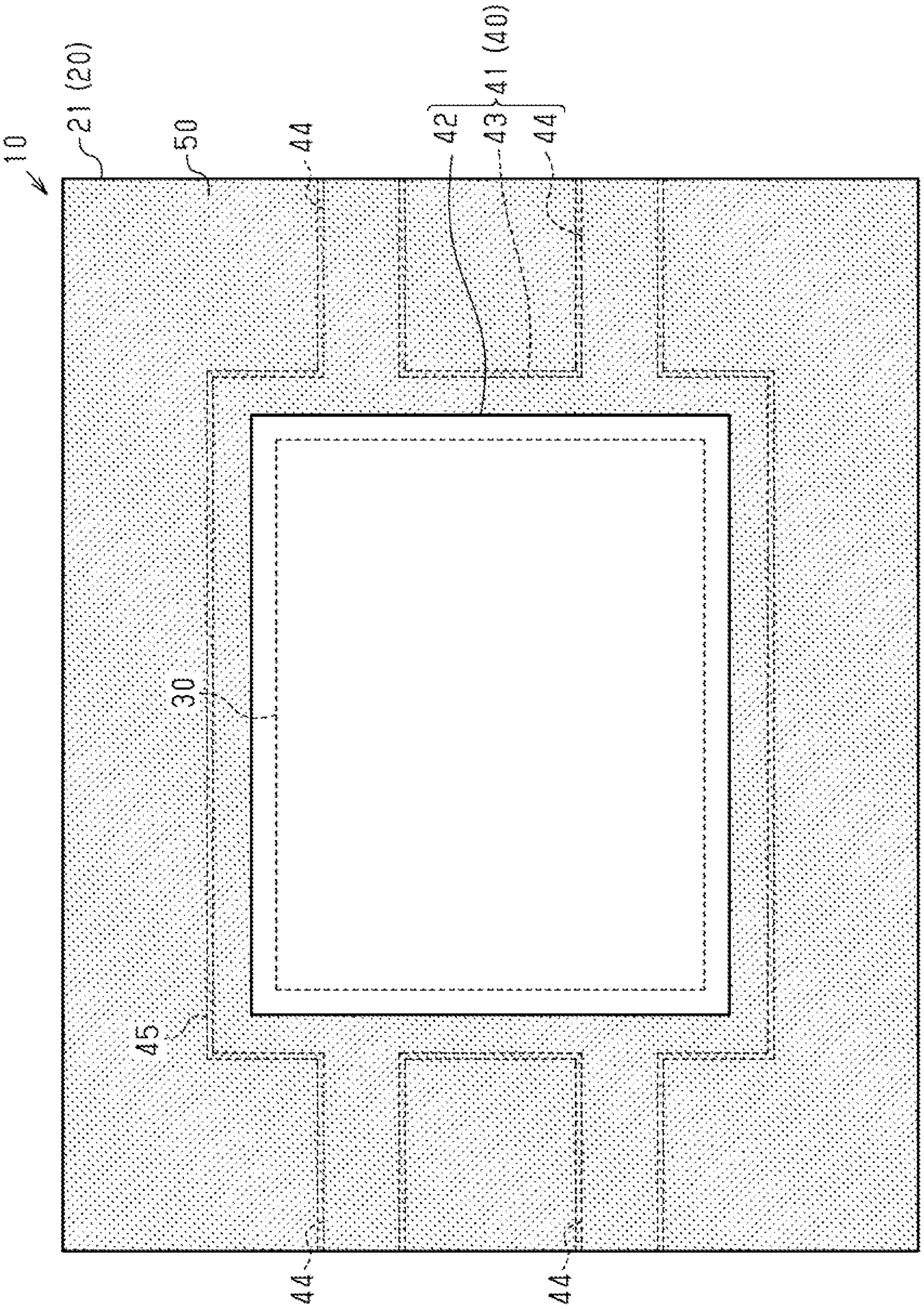
FIG. 17 is a schematic plan view illustrating a modified example of the semiconductor device.

For example, as illustrated in FIG. 17, the leads 44 may be arranged on only two of the four sides of the tetragonal contour of the main body 42. In this modified example, the leads 44 are arranged on the two lateral sides, namely, the left and right sides as viewed in FIG. 17.

Figure 18:
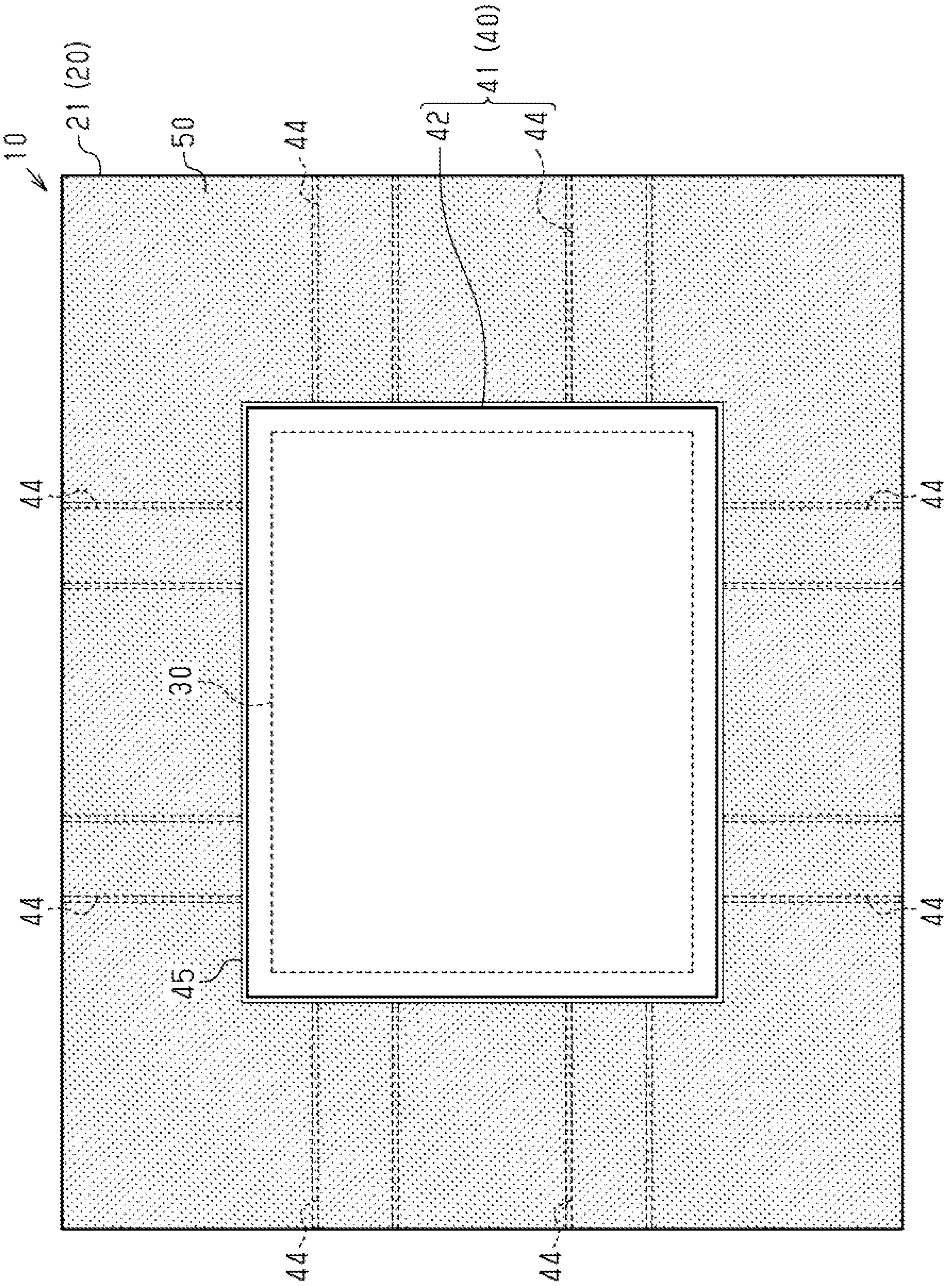
FIG. 18 is a schematic plan view illustrating another modified example of the semiconductor device.

As illustrated in the example of FIG. 18, the projection 43 (FIG. 2) may be omitted from the heat dissipating plate 40. In this case, the leads 44 project outward from the side surfaces of the main body 42. In this case, only the leads 44 of the heat dissipating plate 40 are embedded in the encapsulation resin 50.

The planar shape of the main body 42 in the above embodiment may be changed. For example, the planar shape of the main body 42 may be changed to a polygon other than a tetragon, a circle, or an ellipse.

The surface of the surface-processed layer 45 does not have to be rough. For example, the surface of the surface-processed layer 45 may be smooth.

The surface-processed layer 45 of the above embodiment may be omitted.

The surface-processed layer 45, which covers the lower surface of the base 41, does not have to be an oxide film. For example, the surface-processed layer 45 may be replaced by a metal layer.

Figure 19A:
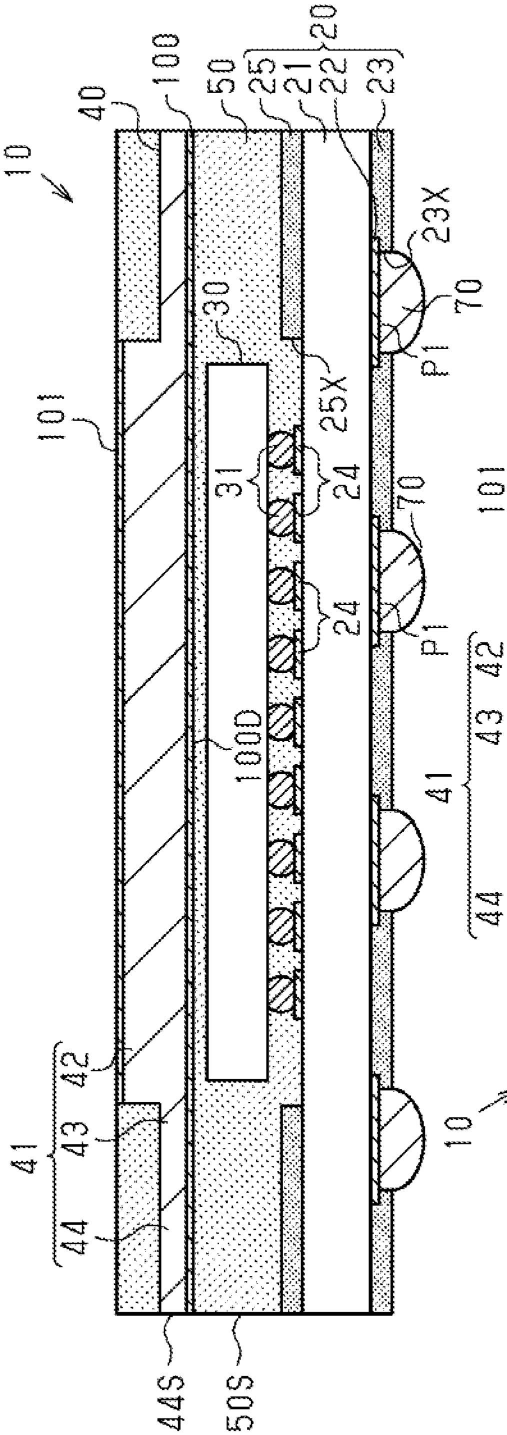
FIG. 19A is a schematic cross-sectional view illustrating a further modified example of the semiconductor device.
Figure 19B:
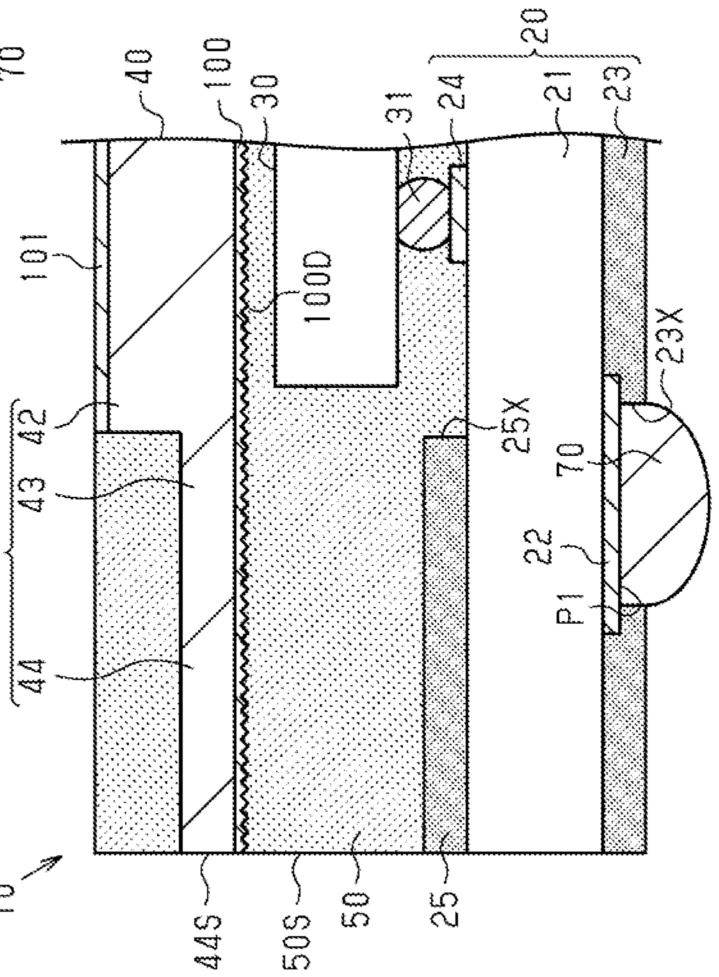
FIG. 19B is a partially enlarged cross-sectional view of the semiconductor device illustrated in FIG. 19A.

As illustrated in the example of FIGS. 19A and 19B, the surface-processed layer covering the lower surface of the base 41 may be a rough plating layer 100. As illustrated in FIG. 19B, the rough plating layer 100 is a plating layer have a rough surface. The rough plating layer 100 includes a lower surface 100D having a greater surface roughness than the lower surface of the base 41. The surface roughness (Ra value) of the lower surface 100D of the rough plating layer 100 may be, for example, 200 nm or greater. The material of the rough plating layer 100 may be, for example, a metal such as Ni, chromium (Cr), Sn, cobalt (Co), iron (Fe), and Pd, or an alloy containing at least one selected from a group consisting of these metals. The rough plating layer 100 in this example is a rough Ni plating layer. The roughness of the lower surface 100D of the rough plating layer 100 may be set, for example, by adjusting the composition and current density of the plating solution when forming the rough plating layer 100 through an electrolytic plating process.

In the semiconductor device 10 of this modified example, a surface-processed layer 101 is formed on the upper surface of the main body 42. The surface-processed layer 101, for example, covers the entire upper surface of the main body 42. The upper surface of the surface-processed layer 101 is smooth and has a lower surface roughness than the lower surface 100D of the rough plating layer 100. The upper surface of the surface-processed layer 101 is, for example, exposed from the upper surface of the encapsulation resin 50. The upper surface of the surface-processed layer 101 is, for example, flush with the upper surface of the encapsulation resin 50. The surface-processed layer 101 is formed on, for example, only the upper surface of the main body 42 among the surfaces of the base 41. Examples of the surface-processed layer 101 include an Ag layer, an Au layer, a Ni layer, a Ni layer/Au layer, a Ni layer/Pd layer/Au layer, and a Ni layer/Ag layer.

The structure of the wiring substrate 20 in the above embodiment may be changed. For example, the solder resist layer 25 may be omitted. For example, the wiring layer 24 may be changed in layout and quantity of portions. For example, the wiring layer 22 may be changed in layout and quantity of portions.

Figure 20:
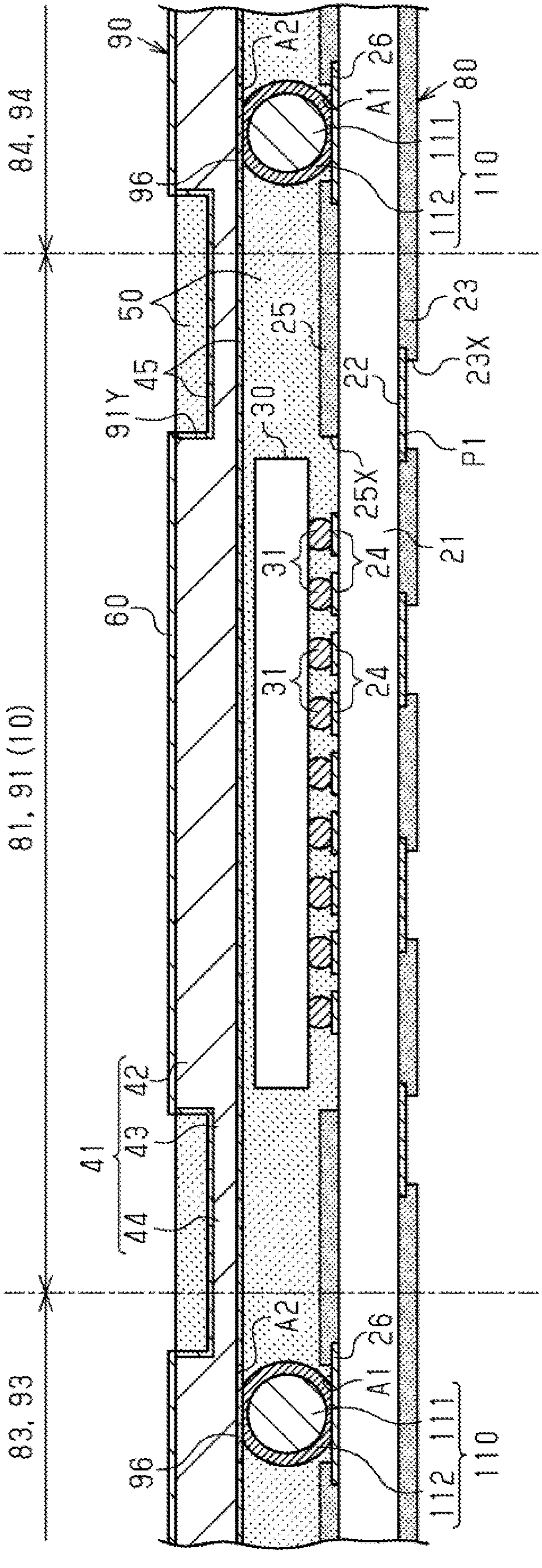
FIG. 20 is a schematic cross-sectional view of another modified example of the semiconductor device illustrating a manufacturing method.

As illustrated in the example of FIG. 20, the first substrate 80 and the second substrate 90 may be connected by connecting members other than the metal posts 98. For example, the connecting members may be changed to solder balls 110. The solder balls 110 each include, for example, a spherical copper core ball 111 and solder 112 surrounding the copper core ball 111. The solder 112 is bonded to the corresponding first connecting portion A1 and to the corresponding second connecting portion A2.

In the modified example of FIG. 20, the copper core ball 111 is used as the conductive core ball of each core-incorporating solder ball 110. Instead of the copper core ball 111, a conductive core ball formed from a metal other than copper such as gold or nickel may be used. Alternatively, a resin core ball formed from a resin may be used. Instead of a core-incorporating solder ball, a solder ball having no core ball, such as a conductive core ball or a resin core ball, may be used.

The structure of the first substrate 80 in the above embodiment may be changed. For example, the quantity and layout of the first connecting portions A1 may be changed. For example, a first connecting portion A1 may be arranged between two adjacent ones of the first product regions 81 in the lateral direction as viewed in FIG. 5.

The structure of the second substrate 90 may be changed. For example, the quantity and layout of the second connecting portions A2 may be changed. For example, a second connecting portion A2 may be arranged between two adjacent ones of the second product regions 91 in the lateral direction as viewed in FIG. 8.

There is no limitation to the quantity of semiconductor elements 30 mounted on the wiring substrate 20. For example, two or more semiconductor elements 30 may be mounted on the wiring substrate 20.

The semiconductor element 30 of the above embodiment may be mounted on the wiring substrate 20 in any manner. For example, the semiconductor element 30 may be mounted through flip-chip mounting, wire bonding, solder bonding, or a combination of these mounting methods.

CLAUSES

This disclosure further encompasses the following embodiments.

1. A method for manufacturing a semiconductor device, the method including:
   - preparing a first substrate including first product regions, a first non-product region, and first connecting portions arranged in the first non-product region;
   - mounting a semiconductor element on each of the first product regions;
   - preparing a second substrate including second product regions, a second non-product region, and second connecting portions arranged in the second non-product region;
   - bonding connecting members to the first connecting portions or the second connecting portions;
   - arranging the second substrate above the first substrate so that the first product regions respectively face the second product regions and so that the first connecting portions respectively face the second connecting portions;
   - connecting the first connecting portions and the second connecting portions with the connecting members;
   - forming an encapsulation resin that encapsulates the semiconductor element and the connecting members and fills a space between the first substrate and the second substrate and a space between the semiconductor element and the second substrate; and
   - fragmenting the first substrate, the second substrate, and the encapsulation resin along edges of the first product regions and edges of the second product regions, in which
   - each of the second product regions includes a main body that is arranged overlapping the semiconductor element in plan view, and a lead that projects outward from the main body and is thinner than the main body, and
   - the encapsulation resin subsequent to the fragmenting covers an upper surface and a lower surface of the lead, exposes an outer side surface of the lead defined by a cut surface, and exposes an upper surface of the main body.
2. The method according to clause 1, in which the connecting members are metal posts.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A semiconductor device, comprising:
- a wiring substrate;
- a semiconductor element mounted on the wiring substrate;
- a heat dissipating plate arranged above the semiconductor element; and
- an encapsulation resin that encapsulates the semiconductor element and fills a space between the wiring substrate and the heat dissipating plate and a space between the semiconductor element and the heat dissipating plate, wherein the heat dissipating plate includes:
- a main body arranged overlapping the semiconductor element in plan view, and
- a lead projecting outward from the main body, the lead is thinner than the main body, the lead includes:
- an upper surface covered by the encapsulation resin,
- an outer side surface located at an outer edge of the semiconductor device and exposed from an outer side surface of the encapsulation resin, and the main body includes an upper surface exposed from an outer surface of the encapsulation resin, the heat dissipating plate further includes a projection projecting from a side surface of the main body toward the outer edge of the semiconductor device, the projection surrounds the main body in plan view, the projection is thinner than the main body, the lead projects from a side surface of the projection toward the outer edge of the semiconductor device, and the encapsulation resin covers an upper surface of the projection and the side surface of the projection.

2. The semiconductor device according to claim 1, wherein
- the heat dissipating plate includes a surface-processed layer that covers a lower surface of the main body,
- the surface-processed layer includes a lower surface that is rough and has a surface roughness that is greater than that of the lower surface of the main body, and
- the encapsulation resin covers the lower surface of the surface-processed layer.

3. The semiconductor device according to claim 2, wherein the surface-processed layer is an oxide film.

4. The semiconductor device according to claim 3, wherein the surface-processed layer covers a side surface of the main body, the upper surface of the lead, and a side surface of the lead excluding the outer side surface of the lead, the upper surface of the main body is exposed from the surface-processed layer and the encapsulation resin, and the semiconductor device further comprises a metal layer that covers the upper surface of the main body.

5. The semiconductor device according to claim 2, wherein the surface-processed layer is a rough plating layer.

6. The semiconductor device according to claim 1, wherein the heat dissipating plate is supported above the wiring substrate by only the encapsulation resin.

7. The semiconductor device according to claim 1, wherein the main body has planar shape of a tetragon, and the lead is arranged on at least two of four sides of the tetragon.

8. A semiconductor device, comprising:

a wiring substrate;

a semiconductor element mounted on the wiring substrate;

a heat dissipating plate arranged above the semiconductor element; and an encapsulation resin that encapsulates the semiconductor element and fills a space between the wiring substrate and the heat dissipating plate and a space between the semiconductor element and the heat dissipating plate, wherein the heat dissipating plate includes:

a main body arranged overlapping the semiconductor element in plan view, and a lead projecting outward from the main body, the lead is thinner than the main body, the lead includes:

an upper surface covered by the encapsulation resin, and an outer side surface located at an outer edge of the semiconductor device and exposed from an outer side surface of the encapsulation resin, the main body includes an upper surface exposed from an outer surface of the encapsulation resin, the heat dissipating plate includes a surface-processed layer that covers a lower surface of the main body, the surface-processed layer includes a lower surface that is rough and has a surface roughness that is greater than that of the lower surface of the main body, and the encapsulation resin covers the lower surface of the surface-processed layer.

9. The semiconductor device according to claim 8, wherein the surface-processed layer is an oxide film.

10. The semiconductor device according to claim 9, wherein the surface-processed layer covers a side surface of the main body, the upper surface of the lead, and a side surface of the lead excluding the outer side surface of the lead, the upper surface of the main body is exposed from the surface-processed layer and the encapsulation resin, and the semiconductor device further comprises a metal layer that covers the upper surface of the main body.

11. The semiconductor device according to claim 8, wherein the surface-processed layer is a rough plating layer.

12. The semiconductor device according to claim 8, wherein the heat dissipating plate is supported above the wiring substrate by only the encapsulation resin.

13. The semiconductor device according to claim 8, wherein the main body has planar shape of a tetragon, and the lead is arranged on at least two of four sides of the tetragon.

* * * * *